United States Patent
Yoshida et al.

(10) Patent No.: US 7,240,253 B2
(45) Date of Patent: Jul. 3, 2007

(54) SEMICONDUCTOR STORAGE DEVICE

(75) Inventors: Hiroyasu Yoshida, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 295 days.

(21) Appl. No.: 10/817,860

(22) Filed: Apr. 6, 2004

(65) Prior Publication Data

US 2004/0205429 A1    Oct. 14, 2004

(30) Foreign Application Priority Data

Apr. 8, 2003    (JP)    ............... 2003-103805

(51) Int. Cl.
*G01R 31/28*    (2006.01)
(52) U.S. Cl. ..................... 714/718; 714/719
(58) Field of Classification Search ......... 714/718–725
See application file for complete search history.

(56) References Cited

U.S. PATENT DOCUMENTS

| | | | | |
|---|---|---|---|---|
| 5,646,948 A * | 7/1997 | Kobayashi et al. | ......... | 714/719 |
| 5,673,270 A * | 9/1997 | Tsujimoto | ............... | 714/718 |
| 5,724,366 A * | 3/1998 | Furutani | .................. | 714/719 |
| 5,903,582 A * | 5/1999 | Miyazaki | ................. | 714/800 |
| 5,946,247 A * | 8/1999 | Osawa et al. | .......... | 365/201 |
| 6,094,733 A * | 7/2000 | Momohara | .............. | 714/718 |
| 6,243,307 B1 * | 6/2001 | Kawagoe | ............. | 365/201 |
| 2001/0027545 A1 * | 10/2001 | Fujiwara | ................. | 714/718 |
| 2002/0162064 A1 * | 10/2002 | Shimizu | ................... | 714/726 |
| 2003/0041299 A1 * | 2/2003 | Kanazawa et al. | .......... | 714/766 |
| 2003/0070121 A1 * | 4/2003 | Mori et al. | ................... | 714/42 |

FOREIGN PATENT DOCUMENTS

| | | |
|---|---|---|
| JP | 4-356799 | 12/1992 |
| JP | 2000-40397 | 2/2000 |

* cited by examiner

*Primary Examiner*—Albert Decady
*Assistant Examiner*—Saqib J. Siddiqui
(74) *Attorney, Agent, or Firm*—Young & Thompson

(57) ABSTRACT

A testing device for a semiconductor storage device suppresses the increase in the circuit size, provides for facilitated accommodation to a test with frequent changes in the test pattern, and improves testability of the semiconductor storage device. A plurality of holding circuits are provided holding write data for memory cells of a memory cell array. (Original) The write data from the holding circuits are written in the memory cells of the selected address. A plurality of comparators are supplied with data read out from the memory cells and with data held by the holding circuits as expectation data to compare the readout data and the expectation data. The non-inverted or inverted value of the write data held by the holding circuits is output as the write data to the memory cells and as expectation data to the comparators depending on the value of the inversion control signal.

9 Claims, 16 Drawing Sheets

SEMICONDUCTOR STORAGE DEVICE

FIELD OF THE INVENTION

This invention relates to a semiconductor storage device and, more particularly, to a semiconductor storage device convenient for parallel testing employing a testing device.

BACKGROUND OF THE INVENTION

As a parallel test, employing a testing device, a line mode test for semiconductor devices has become known (see for example the non-patent publication 1). First, the line mode test is briefly explained. FIG. 13 shows the structure of a semiconductor storage device disclosed in the non-patent publication 1. The storage device shown in FIG. 13 includes a multi-purpose register MPR (write/expectation value register) 1101 and a comparator circuit 1102 for complementary sub-IO lines SIO_T, SIO_B (bit line pair). The comparator circuit 1102 is formed by an Ex-OR circuit, and an output signal (coincidence detection signal) MATCH is wired-OR connected. The multi-purpose register MPR 1101, comprising a flip-flop formed by cross-connection of an output and an input of an inverter composed of a P-channel MOS transistor P41 and an N-channel MOS transistor N49 and an inverter composed of a P-channel MOS transistor P42 and an N-channel MOS transistor N50, is connected across a main I/O line pair (MIOT, MIOB) and a sub I/O line pair (SIO_T, SIO_B), in order to perform copy/write in a line mode test (LMT) and parallel comparison by line read. During the time of activation of the multi-purpose register MPR (write/expectation register) 1101, the power supply potential and the ground potential are supplied to CRE_B and CRE_T of the multi-purpose register MPR (write/expectation value register) 1101.

During the line mode test, test data are written in the multi-purpose register MPR (write/expectation value register) 1101, in which a random patterns possible on one line. The random pattern data are simultaneously written in the memory cells connected to the selected word line. A signal TR is in a high level, while a test compare trigger signal COMP is in a low level. The complementary data of the main IO lines MIOT, MIOB are stored in the flip-flop of the multi-purpose register MPR (write/expectation value register) 1101, and transmitted to the complementary sub-IO lines SIO_T, SIO_B via the N-channel MOS transistors N41, N42 in the on-state so as to be written in the memory cells connected to the selected word line.

When the test compare trigger signal COMP is in a high level and the signal TR is in a low level, parallel comparison is carried out in each comparator 1102 to detect coincidence between the readout data and the expectation data. Specifically, the N-channel MOS transistors N41, N42 are off, while the N-channel MOS transistors N43, N44 are on. When MIOT and MIOB as write data are in the high level and in the low level, respectively, the N-channel MOS transistor N46, the gate of which is supplied with a value held by the multi-purpose register MPR (write/expectation value register) 1101 is turned on, while the N-channel MOS transistor N45 is turned off. When the sub-IO line SIO_B, transmitting the readout data, is high (in case of failure), the N-channel MOS transistor N48 is turned on, with the coincidence detection signal MATCH being in the low level (error detected). When the sub-IO line SIO_B is low, the N-channel MOS transistor N48 is turned off, with the coincidence detection signal MATCH being in the high level. In case of writing with the main IO lines MIOT, MIOB being in the low level and in the high level, respectively, the N-channel MOS transistor N45 is turned on to detect an error in similar manner. If even only one of plural comparators, connecting to the signal line MATCH, is non-coincident, an error signal is sent out from MATCH and output to an output terminal DQ, not shown. Any failure on a line is detected by one read cycle.

As a modification of the line mode test, there is also known a structure in which write data and expectation data are directly supplied from a write bus (see for example the Patent Publication 1). In this conventional semiconductor storage device, the data read out from each selected one of plural columns is compared to expectation data by test means and the result of comparison is output. The test means for conducting a test on plural columns is provided common to the columns. Specifically, as shown in FIG. 14 hereof (corresponding to FIG. 2 of the Patent Publication 1), a first differential amplifier 60 is connected to bit line pairs BL, /BL. There are provided write buses W, /W, readout buses R, /R and a readout/test circuit 7. During a test, a column decoder 4 compares the data read out from every other bit line pair of plural bit line pairs BL, /BL to a given expectation data and respective results of comparison are output. The column decoder 4 then compares the remaining ones of the bit line pairs BL, /BL to a given expectation to output respective results of comparison. The readout/test circuit 7 includes a switch 71 connected across the readout buses R, /R and data buses DB, /DB, a switch 72 connected across the readout buses k, /R and buses for line test LB, /LB, a differential amplifier 73 connected to the data buses DB, /DB, an expectation data write circuit 74 connected to the buses for line test LB, /LB, and an error detection circuit 75 connected to the buses for line test LB, /LB, and outputs an error flag EF if an error is detected during the line mode test.

There is also known a structure including a coincidence detection circuit supplied with readout data from plural cell arrays to detect possible coincidence of the input data to compress 16 IO to 4 IO (see for example the Patent Publication 2).

The structure shown in the block diagram of FIG. 15 is that of a conventional test circuit of the semiconductor device described in the aforementioned Patent Publication 2, in which no expectation data is needed during reading. That is, data may be independently written in a write amplifier of each memory cell, in order to test data interference between neighboring memory cells. That is, first to fourth read/write amplifiers (Ramp and Wamp) 1302 are provided as peripherals of a memory cell array 1301. The memory cell array 1301 includes an X-decoder 1304, supplied with and decoding an X-address to select a word line, a sense amplifier 1305 connected to the bit line and a column decoder 1306 supplied with and decoding a Y-address to select a bit line. These elements as one unit are also termed a 'mat' or a 'cell array block'. In FIG. 15, the X-decoder 1304 may be provided common to plural cellblocks.

A first write data bus, a second write data bus, a third write data bus and a fourth write data bus are connected common to each of the first write amplifiers (Wamp), second write amplifiers (Wamp), third write amplifiers (Wamp) and the fourth write amplifiers (Wamp) of each of the four memory cell arrays 1301. During line testing, the first to fourth write amplifiers are supplied with data from the first to fourth write data buses in parallel. The data from the write amplifier (Wamp) is written in the memory cell connected to the selected word line.

FIG. 16 shows a connection structure of the circuit of FIG. 15 at the time of readout in the parallel test mode. The sense amplifier outputs of the bit lines selected by a column decoder 1306 are amplified by a read amplifier (Ramp), while four output signals output from the first read amplifiers (Ramp) of the four memory cell arrays are supplied to a first comparator 13030. In similar manner, the four output signals output from the second to fourth read amplifiers (Ramp) of the four memory cell arrays are supplied to second to fourth comparators 13031 to 13033. Each of the comparators 13030 to 13033 outputs a 'pass' and a 'fail' when the four input signals are all coincident and when any one of the signals is non-coincident, respectively. In an alternative structure, there is provided a comparator supplied with outputs of comparators 13030 to 13033 to verify the possible coincidence of the comparator outputs to compress the results of comparison.

[Non-Patent Publication 1]

K. ARIMOTO et al. "A 60-ns 3.3-V -Only 16-Mbit DRAM with Multipurpose Register", IEEE, journal of solid-state circuits, vol.24, No.5, October 1989, pp1184-1190

[Patent Publication 1]

Japanese Patent Kokai Publication No. JP-A-4-356799 (pages 5 and 6, FIGS. 1 and 2)

[Patent Publication 2]

Japanese Patent Kokai Publication No. JP-P2000-40397A (page 4, FIG. 3)

SUMMARY OF THE DISCLOSURE

If, in a conventional semiconductor storage device, shown in FIG. 13, the value of the data written in a memory cell is to be changed, data need to be supplied to a register 1101 from the input/output buses MIOT, MIOB. Moreover, expectation data need to be provided each time in association with the readout data. The result is complex testing operations for tests like marching in which data are frequently changed.

On the other hand, if, in the conventional semiconductor storage device, shown in FIG. 13, the values of data written in the memory cell are to be changed, an excess test cycle of supplying data from the input/output buses MIOT and MIOB to the register 1101 is required.

In the structure shown in FIG. 14, write data may be rewritten at the time of writing. However, if expectation data are to be changed during parallel reading, new expectation data need to be provided each time.

Moreover, if the structure similar to that described above is to be implemented in a DRAM (dynamic random access memory) of the pre-fetch system (the system in which data is written in a register prior to writing data in a memory cell), it becomes necessary to provide a write bus, dedicated to the test mode, for re-writing the write data/expectation data each cycle, thus complicating the circuit structure.

In the structure shown in FIGS. 15 and 16, there is no constraint on the setting of the write data. However, due to e.g. inconvenience in the word lines, the data written concurrently is fixed at a high level or at a low level, the first stage coincidence detection circuit gives an output 'pass'. That is, if, in the structure shown in FIG. 16, all of the four readout data supplied to the sole comparator 1303 are inverted data of the expectation data, the output given is 'pass', thus making a mistaken decision.

It is therefore a principal object of the present invention to provide a semiconductor storage device in which it is possible to prevent the circuit from being increased in size and in which accommodation to a test with variable data may be facilitated to contribute to improved testability.

For accomplishing the above object, an apparatus in one aspect of the present invention is a semiconductor storage device having the function of pre-fetching write data before the write cycle, in which a write register for storage of the pre-fetched data (operating as a write register during the normal operation) is used as a write register for parallel testing and as an expectation register for supplying expectation data to the comparator, and in which the value of the write register may be inverted or may remain non-inverted based on the inversion control signal from the external terminal.

According to the present invention, the register holding the write data in advance is used as an expectation data register. During testing, the value of the inversion control signal is controlled from e.g. a tester to enable the write data and the expectation data to be varied without re-writing data in the write register.

According to an aspect of the present invention, there is provided a semiconductor storage device comprising; a memory cell array including a plurality of memory cells; a holding circuit holding data written in the memory cells; a comparator comparing readout data from the memory cell, supplied thereto, and expectation data corresponding to the readout data, supplied thereto, to check whether or not the two coincide with each other; and a control circuit outputting an inverted value or a non-inverted value of data held by the holding circuit, responsive to a value of an inversion control signal supplied to the control circuit along with the data held by the holding circuit; an output from the control circuit being supplied as write data to the memory cell and supplied as the expectation data to the comparator.

According to another aspect of the present invention, there is provided a semiconductor storage device comprising; a memory cell array including a plurality of memory cells provided as an array at the intersections of a plurality of word lines and a plurality of bit lines; a plurality of sense amplifiers connected to the bit lines of the memory cell array; a column decoder selecting bit lines; an IO line connected to the bit line selected by the column decoder, the IO line being a data line exchanging write data and readout data with the memory cell array; a write register storing and holding the write data entered from a data terminal of the semiconductor storage device; a write amplifier driving and outputting the IO line based on the write data held by the write register; a read amplifier connected to the IO line amplifying readout data from the memory cell; a comparator comparing the readout data amplified by the read amplifier and expectation data applied; and a control circuit supplying non-inverted and inverted values of data stored in the write register, based on an input inversion control signal; wherein an output of the control circuit is supplied as the expectation data to the comparator; the write data stored in the write amplifier is written in the memory cell of the selected address during the normal operation and during testing; data is written in the memory cells during testing through the write register, inversion control circuit and the write amplifier; and wherein the readout data read out from the memory cell and amplified by the read amplifier and expectation data output from the inversion control circuit supplied with data held by the write register are supplied to the comparator comparing the readout data and the expectation data.

PREFERRED EMBODIMENTS OF THE INVENTION

Figure 1:
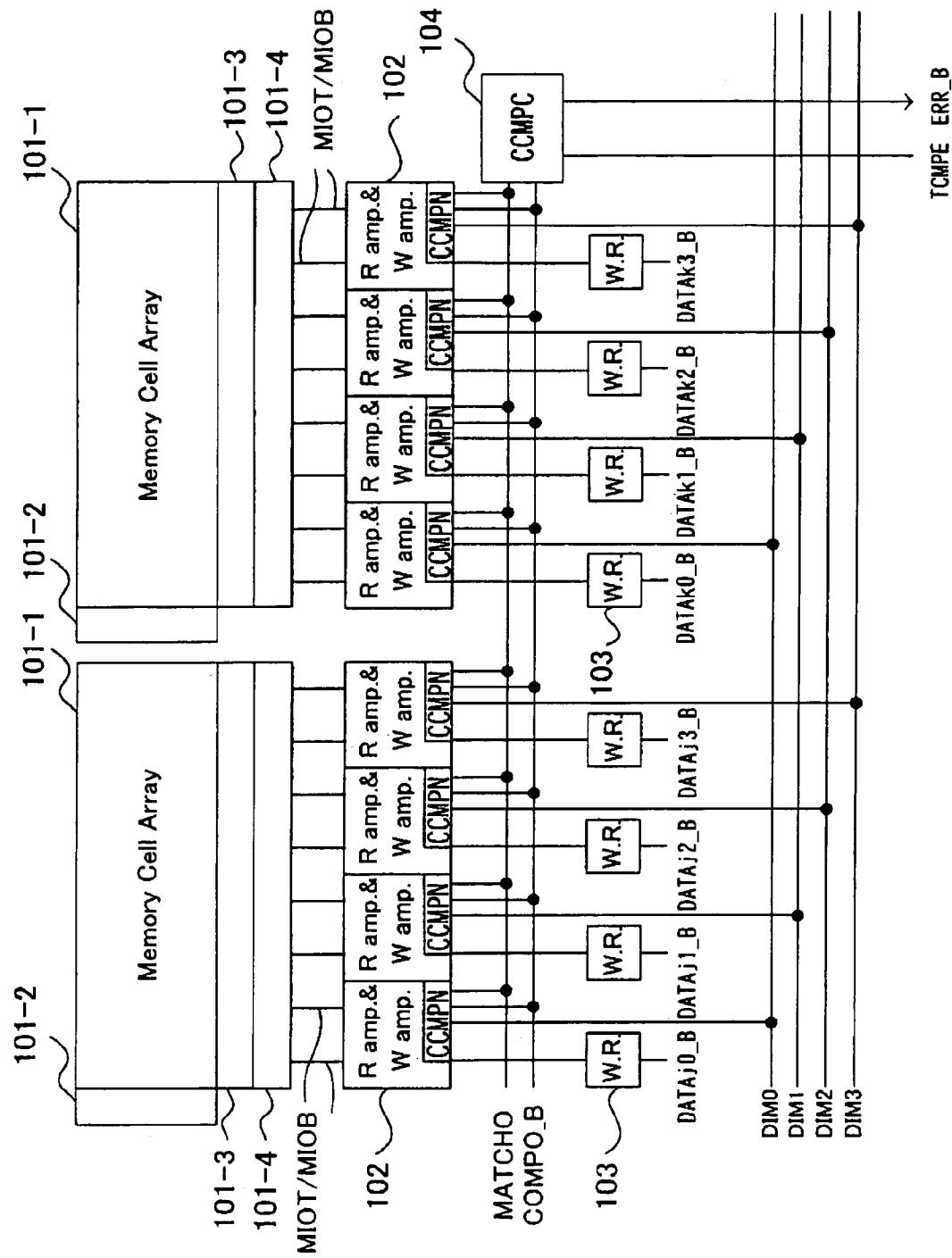
FIG. 1 shows the structure of an embodiment of the present invention.

An embodiment of the present invention is now explained. Referring to FIG. 1, a semiconductor storage device in one aspect of the present invention includes a memory cell array (101-1) including a plurality of memory cells, a holding circuit (103) for holding data written in the memory cells, a comparator (CCMPN) for comparing readout data from the memory cell and expectation data corresponding to the readout data, supplied thereto, in order to check whether or not the two coincide with each other, and an inversion control circuit (see FIG. 3) for outputting an inverted value or a non-inverted value of data held by the holding circuit (103), responsive to the value of an inversion control signal (DIM) supplied thereto along with the data held by the holding circuit (103). An output from the inversion control circuit is supplied as write data to the memory cell and supplied as the expectation data to the comparator (CCMPN).

In an embodiment of the present invention, the holding circuit (103) is used during the normal operation as a circuit for holding write data in the memory cell and is used during testing as a circuit for holding the write test data for the memory cell (write register) and also as a circuit for holding the expectation data (expectation register).

In an embodiment of the present invention, the inversion control signal (DIM) has its value set from an inversion control terminal of the semiconductor storage device. This represents a feature of the present invention. That is, during device testing, the write data and the expectation data for the memory cell may be changed by changing the pattern applied to the inversion control terminal, from the tester, without changing the data held in the write register. That is, the change data write cycle (and hence the test vector for the write cycle) is unneeded in changing the value of the write register.

In an embodiment of the present invention, a plurality of sets, each composed of the holding circuit (103) and the comparator (CCMPN), are provided in association with a plurality of IO lines (MIOT/MIOB) for exchanging write data and readout data with the memory cell array. In a parallel test in which data from the plural holding circuits (103) are written in parallel in the memory cell array (101-1), the value of the inversion control signal (Dimj) entered to the inversion control circuit associated with the holding circuit (103) is changed, without re-writing the data held by the plural holding circuits (103), to provide for a variable pattern of application (forcing) of the parallel test and a variable expectation data pattern. It is another feature of the present invention that the application pattern and the pattern of the expectation data for the parallel test can be realized without the data write cycle in the write register.

In an embodiment of the present invention, there are provided one or plural sets of the holding circuit (103), a read write amplifier (102), an inversion control circuit and a comparator (CCMPN) in association with one data terminal (DQ) of the semiconductor storage device, in association with one data terminal (DQ) of the semiconductor storage device. A selector circuit (e.g. 406 of FIGS. 7 and 407 of FIG. 7) may be provided in association with one data terminal for selecting the write data from the one data terminal or the write test data applied, based on the input test control signal (for example, TRATA of FIG. 7), with an output of the selector circuit being entered to the associated holding circuit (103). It should be noted that the write test data (e.g. TDINR_B, TDINF_B in FIG. 7) applied to the selector circuit (e.g. 406 of FIGS. 7 and 407 of FIG. 7) is entered from a preset data terminal different from the one data terminal and supplied to the selector circuit. That is, the write test data entered from the preset data terminal are supplied to the plural selection circuits in common and, during parallel testing, the plural selection circuits select the write test data (TDINR_B, TDINF_B), with the write test data (TDINR_B, TDINF_B) being supplied to the plural holding circuits (write registers) in common. The input data from the one data terminal is supplied to plural write registers to reduce the number of provers during the wafer testing as well as the number of the pin counts needed in a tester.

In an embodiment of the present invention, a plurality of the comparators (CCMPN), each provided in association with one of a plurality of the read amplifiers (Ramp) for amplifying the readout data from the memory cell, are connected common to common signal lines (MATCH0, COMP0_B) indicating the results of comparison. If at least one of the plural comparators (CCMPN) detects the non-coincidence of the readout data with the expectation data, the failure information 'fail' is output to the common signal line (MATCH0). In an embodiment of the present invention, the common signal line is made up by a first signal line (MATCH0) and a second signal line (COMP0_B). The first signal line and the second signal line are pre-set to a first value before start of the comparison operation by the comparator (CCMPN). During the comparison operation, the second signal line (COMP0_B) is set to a second value (e.g.

the ground potential). A plurality of comparators (CCMPN) are connected parallel to one another across the first and second signal lines.

In an embodiment of the present invention, the comparator (CCMPN) performs control so that, when the readout data coincides with the expectation value, the first signal line (MATCH0) and the second signal line (COMP0_B) maintain the first and second values, respectively. When the readout data is not coincident with the expectation data, the current is caused to flow through the first signal line (MATCH0) and the second signal line (COMP0_B) to provide for the same current value.

In an embodiment of the present invention, the comparator includes first and second switching devices (N21, N22 of FIG. 4), connected in series across the first signal line (MATCH0) and the second signal line (COMP0_B), and having a control terminal supplied with the complementary signal of readout data (MAQ_B) and the expectation data (WDATA) so as to be thereby controlled on or off, and third and fourth switching devices (N23, N24 of FIG. 4), connected in series across the first and second signal lines, and having a control terminal supplied with the readout data (MAQ) and a complementary signal of the expectation data (WDATA_B) so as to be thereby controlled on or off.

In an embodiment of the present invention, there is provided a decision circuit (104) connected to a common signal line, connected common to a plurality of the comparators (CCMPN), with the decision circuit outputting the results of pass/fail decision of the plural comparators in their entirety. The common signal line is made up by e.g. the first and second signal lines (MATCH0, COMP0_B) The decision circuit (104) includes a circuit (such as P21 to P23 of FIG.4) for setting the first and second signal lines (MATCH0, COMP0_B) to the first value (power supply voltage), a circuit (such as N25 of FIG.4) for setting the second signal line (COMP0_B) to a second value (e.g. the ground potential) when the value of the control signal (TCMPE) controlling the comparison operation indicates comparison, and a circuit (such as 310, 311) for generating and outputting an error flag (ERR_B) obtained on comparison from the value of the first signal line (MATCH0).

In an embodiment of the present invention, there may be provided a plural number of sets of the first and second signal lines (MATCH0, COMP0_B, MATCH1, COMP1_B of FIG. 11), connected common to the plural comparators (CCMPN), and a decision circuit (104A of FIG. 11), connected to the plural number of sets of the first and second signal lines to output the results of 'pass'/'fail' decision of the totality of the comparators. By splitting the signal lines (MATCH0, COMP0_B and MATCH1, COMP1_B) in this manner, the signal line length may be shorter to improve the response speed at the time of comparison.

In an embodiment of the present invention, a decision circuit (104A) includes a circuit (such as P21 to P26 of FIG. 12) for setting the plural sets of the first signal lines (MATCH0, MATCH1) and the second signal lines (COMP0_B and COMP1_B) to the first value, a circuit (such as N25 and N31 of FIG. 12) for setting plural sets of the second signal lines (COMP0_B and COMP1_B) to a second value when the value of the control signal controlling the comparison operation indicates comparison, and a circuit (such as 312, 311) having a plurality of input ends connected to plural sets of the first signal lines for generating an error flag and outputting the so generated error flag, which error flag assumes a value indicating 'pass' and a value indicating 'fail' when the totality of the plural sets of the first signal lines assume a first value and when at least one of the plural sets of the first signal lines assumes a second value.

Embodiments

An embodiment of the present invention is now explained in further detail. FIG.1 is a schematic block diagram showing the structure of an embodiment of the present invention. The semiconductor storage device of the present embodiment has a pre-fetch function, such as an SDRAM (synchronous DRAM) or RDRAM (trademark of a product by Rambus Inc.) A write register for storage of pre-fetched data is used as a write register and as an expectation register for a parallel test, and the value of the write register is inverted and restored based on an inversion control signal from an external terminal. Referring to FIG.1, four write registers 103 and four read/write amplifiers (Ramp and Wamp) 102 are provided for a memory cell array 101-1, and each read/write amplifier (Ramp and Wamp) 102 is provided with a comparator (CCMPN) for comparing readout data and the expectation data to each other. Referring to FIG.1, the memory cell array 101-1 is provided with an X-decoder 101-2, supplied with and decoding an X-address to select a word line, not shown, a sense amplifier 101-3, connected to a bit line pair, not shown, and a column decoder (Y-switch) 101-4, supplied with and decoding a Y-address to select a bit line pair. These elements together are termed a 'mat' or a 'cell array block'. Of course, the X-decoder 101-2 may be arranged common to plural cell array blocks.

The write data entered from a data input/output terminal DQ, not shown, is sampled by the write register 103, and an output of the write register 103 is supplied to a write amplifier (Wamp) of the read/write amplifier (Ramp and Wamp) 102. During writing, an output of the write amplifier (Wamp) is sent to an I/O line pair MIOT, MIOB, where T and B denote non-inverted and inverted, respectively. Data is written in the memory cell of the bit line pair and the word line selected in the memory cell array 101-1. Meanwhile, the semiconductor storage device of FIG. 1 is constructed as a clock synchronization type memory and four write registers (W·R) 103 provided to the memory cell array 101-1 are designed to store and hold data expanded from write data D[0], D[1], D[2] and D[3] serially input in synchronism with clocks from the sole data input terminal DQ, not shown. The memory cell array 101-1 is formed by plural banks.

In FIG. 1, inversion control signals DIM0, DIM1, DIM2 and DIM3 are supplied to the four read/write amplifiers (Ramp and Wamp) 102, and represent signal lines (buses) for controlling data inversion from a write register. The inversion control signals DIM0, DIM1, DIM2 and DIM3 may be connected to a sole external terminal or to separate external terminals.

The comparators CCMPN, provided separately to the read/write amplifiers (Ramp and Wamp) 102, are supplied with readout data output from an associated read amplifier (Ramp) and with data held by the associated write register 103, as expectation data or inverted signal thereof. An output representing the results of comparison is supplied via a coincidence detection signal MATCH0 to a decision circuit 104 common to the plural cell array blocks.

In case 'fail' is detected in one of the comparators (CCMPN), the decision circuit 104 activates an error flag ERR_B and outputs a 'fail'. The comparator (CCMPN) is coupled common to the coincidence detection signal MATCH0 and to the signal COMP0_B. During the operation of comparison, control is managed so that the signal line COMP0_B is connected to for example the ground potential and so that, in case the comparator (CCMPN) has detected non-coincidence between the readout data and the expectation, the signal line MATCH0 and the signal line COMP0_B are set to current conducting states.

During parallel testing, data are written in parallel from the write registers 103 to the plural memory cells. In the case of 128 MDRAM, in which 128 read/write amplifier circuits are arranged in parallel, 128 bits are written in parallel.

During parallel writing in the memory cell, the inverted versions of the held values of the write register may be written by corresponding setting of the inversion control signals DIM0, DIM1, DIM2 and DIM3. During testing, the values of the inversion control signals DIM0, DIM1, DIM2 and DIM3 are set from a tester.

During parallel reading, the comparator (CCMPN) compares data, read out from the memory cell, to a value held in the write registers 103 (expectation) to verify pass/fail. Assuming that, in case the values of the inversion control signals DIM0, DIM1, DIM2 and DIM3 are logical 0, the non-inverted value of the write registers 103 is supplied as write data and the expectation, and that, in case the values of the inversion control signals DIM0, DIM1, DIM2 and DIM3 are logical 1, the inverted value of the write registers 103 is supplied as the write value and the expectation, it is possible to conduct a parallel test, using patterns of respective different combinations, by changing the patterns of the inversion control signals DIM0, DIM1, DIM2 and DIM3, with the held values of the write registers 103 remaining fixed.

The data writing to the write registers 103 is carried out in the write register mode. With the SDRAM, the write register mode is executed by corresponding setting in a command register, not shown. In the present embodiment, only data setting in the write register is made in the write register mode, without data writing in the memory cell.

The data writing to the memory cell is carried out in the memory write mode. It is noted that the memory write mode is set by corresponding setting in a command register, not shown. The data written in advance in the write registers 103 are written in the memory cells connected to the selected word line. Since writing is from the write registers 103, writing may be made within one cycle.

Figure 2:
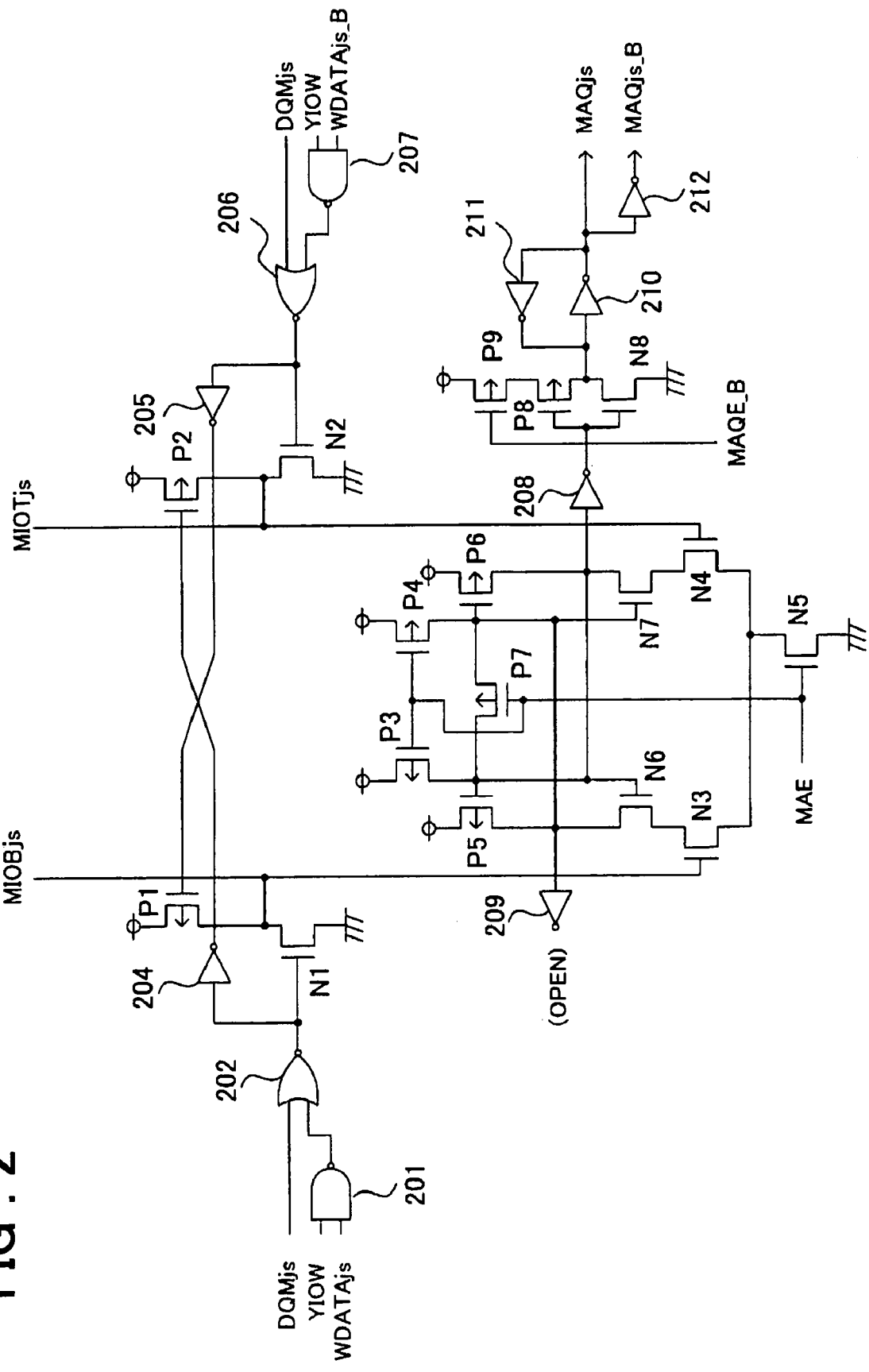
FIG. 2 shows the structure of the read/write amplifier in the embodiment of the present invention.

FIG. 2 shows a typical circuit structure of the read/write amplifier (Ramp and Wamp) 102. Meanwhile, the read amplifier (Ramp) amplifies data read out to the I/O line pair MIOT, MIOB to drive a read data bus, not shown, and is also termed a 'data amplifier' or a 'main amplifier'. Referring to FIG. 2, the write amplifier (Wamp) includes a NAND circuit 201, supplied with write data WDATAjs, where j is a serial number of the data terminal DQ and assumes 0 to 31 in case of 32-bit data, and s is a serial address in a 4-bit pre-fetch and assumes 0 to 3 in the case of the structure shown in FIG. 1, and with a write enable signal YIOW, a NOR circuit 202 supplied with an output signal of the NAND circuit 201 and with a write mask signal DQMjs, an inverter 204 supplied with an output signal of the NOR circuit 202, a NAND circuit 207, supplied with an inverted version WDATAjs_B of write data WDATAjs, where j is the serial number of the data terminal DQ and s is a serial address in a 4-bit pre-fetch, with s=0 to 3, and with the write enable signal YIOW, a NOR circuit 206, supplied with an output signal of the NAND circuit 207 and a write mask signal DQMjs, as inputs, an inverter 205, supplied with an output signal of the NOR circuit 206, as an input, an N-channel MOS transistor N1, having a source grounded, having a drain connected to an IOline MIOBjs and having a gate connected to an output end of the NOR circuit 202 and a p-channel MOS transistor P1 having a source connected to the power supply VCC, having a drain connected to the drain of the n-channel transistor N1 and having a gate connected to an output of the inverter 205. The write amplifier (Wamp) also includes an N-channel MOS transistor N2 having a source grounded, having a drain connected to an I/O line MIOTjs and having a gate connected to an output of the NOR circuit 206, and a P-channel MOS transistor P2, having a source connected to the power supply, having a drain connected to the drain of the N-channel transistor N2 and having a gate connected to an output of the inverter 204. The IO line pair MIOTjs and MIOBjs, where j denotes the serial number of the data terminals and s is 0 to 3, are connected to the column decoders 101-4 of FIG. 1.

The operation of the write amplifier shown in FIG. 2 is now explained. During the write operation, when the write data WDATAjs is at a high level, the NAND circuit 201 goes low responsive to the high level of the write enable signal YIOW. Since the write mask signal DQMjs is at a low level during the write operation, the output of the NOR circuit is at a high level to turn the N-channel MOS transistor N1 on. The output of the inverter 204 is at a low level to turn the P-channel MOS transistor P2 on. At this time, the complementary signal WDATAjs_B of the write data WDATAjs is at a low level, so that the output of the NAND circuit 207 goes high and hence the output of the NOR circuit 206 goes low to turn the N-channel MOS transistor N2 off. The output of the inverter 205 goes high to turn off the P-channel MOS transistor P1. Hence, when the write data WDATAjs is at a high level, the IO line MIOBjs is discharged through the N-channel MOS transistor N1 to a ground potential. On the other hand, the IO line MIOTjs is charged through the P-channel MOS transistor P2, which is in the on-state, from the power supply side, to the power supply potential. That is, the IO lines MIOTjs and MIOBjs are driven to a high level and to a low level, respectively.

In similar manner, when the write data WDATAjs is at a low level, the IO lines MIOTjs and MIOBjs are driven to a low level and to a high level, respectively.

The read amplifier (Ramp) is now explained. The read amplifier (Ramp) includes a constant current source transistor N5, having a source grounded and having a gate supplied with a read amplifier enable signal MAE, N-channel MOS transistors N3 and N4, having sources connected common and connected to the drain of the constant current source transistor N5 and having gates connected to the paired IO lines MIOTjs and MIOBjs to form a differential pair, N-channel MOS transistors N6 and N7 having sources connected to the drains of the N-channel MOS transistors N3 and N4, and P-channel MOS transistors P3 and P4, having sources connected to the power supply, having gates connected common and having gates connected to the gates of the N-channel MOS transistors N6 and N7. The read amplifier (Ramp) also includes P-channel MOS transistors P5 and P6, having sources connected to the power supply and having drains connected to the drains of the N-channel MOS transistors N6 and N7, and a P-channel MOS transistor P7 connected across the gates of the P-channel MOS transistors P5 and P6 and having gates connected to the amplifier enable signal MAE. The connection node of the gates of the P-channel MOS transistors P3 and P4 is connected to the gate of the P-channel MOS transistor P7.

The drain of the N-channel MOS transistor N7 is connected to an input end of the inverter 208. There are provided a CMOS inverter, made up by an N-channel MOS transistor N8 and a P-channel MOS transistor P8, and a P-channel MOS transistor P9, connected across the power supply and the source of the P-channel MOS transistor P8 and having a gate supplied with a read amplifier output enabling signal MAQE_B. An output end of the inverter 208 is connected to an input end of a CMOS inverter (a common gate of the transistors P8 and N8), and an output end of the CMOS inverter is connected to a flip-flop, made up by the inverters 210 and 211, while an output signal of the flip-flop and an inverted signal thereof are output as MAQjs and MAQj_Bjs. Meanwhile, an inverter 209 having an open output is provided in association with the inverter 208, and is a dummy circuit for adjusting the load balance of the paired IO lines MIOTjs and MIOBjs.

The operation of the read amplifier of FIG. 2 is explained. When the read amplifier enable signal MAE is low, the N-channel MOS transistor N5 is turned off, the P-channel MOS transistors P3, P4 and P7 are turned on, the gate potential of the N-channel MOS transistors N6 and N7 is the power supply potential VCC and the P-channel MOS transistors P5, P6 are turned off.

If, during readout, the read amplifier enable signal MAE is at a high level, the N-channel MOS transistor N5 is turned on to drive the differential pair at a constant current, such that the P-channel MOS transistors P3, P4 and P7 are turned off.

When the IO line MIOTjs is at a high level (and hence the complementary IO line MIOBjs is at a low level), the N-channel MOS transistor N4 is turned on, the N-channel MOS transistor N3 is turned off, the drain potential of the N-channel MOS transistor N7 goes low, and an output of the inverter 208 goes high. The output of the CMOS inverter, activated when the read amplifier output enabling signal MAQE_B is at a low level (output enabling state), goes low, and the inverter 210 outputs a high level as an output signal MAQ js.

When the IO line MIOTjs is at a low level (when the MIOBjs is at a high level), the N-channel MOS transistor N3 is turned on, the N-channel MOS transistor N4 is turned off, the drain potential of the N-channel MOS transistor N7 goes high and the output of the inverter 208 is at a low level. The output of the CMOS inverter, activated when the read amplifier output enabling signal MAQE_B is at a low level, goes high, and the output signal MAQjs of the inverter 210 goes low. It is noted that the structure shown in FIG. 2 as the write amplifier and the read amplifier is merely exemplary such that the write amplifier and the read amplifier are not limited to the above structure and any suitable circuit structure may be used provided that the circuit used operates as a write amplifier for differentially driving the IO line pair MIOT, MIOB and as a read amplifier for amplifying the differential inputs, respectively.

Figure 3:
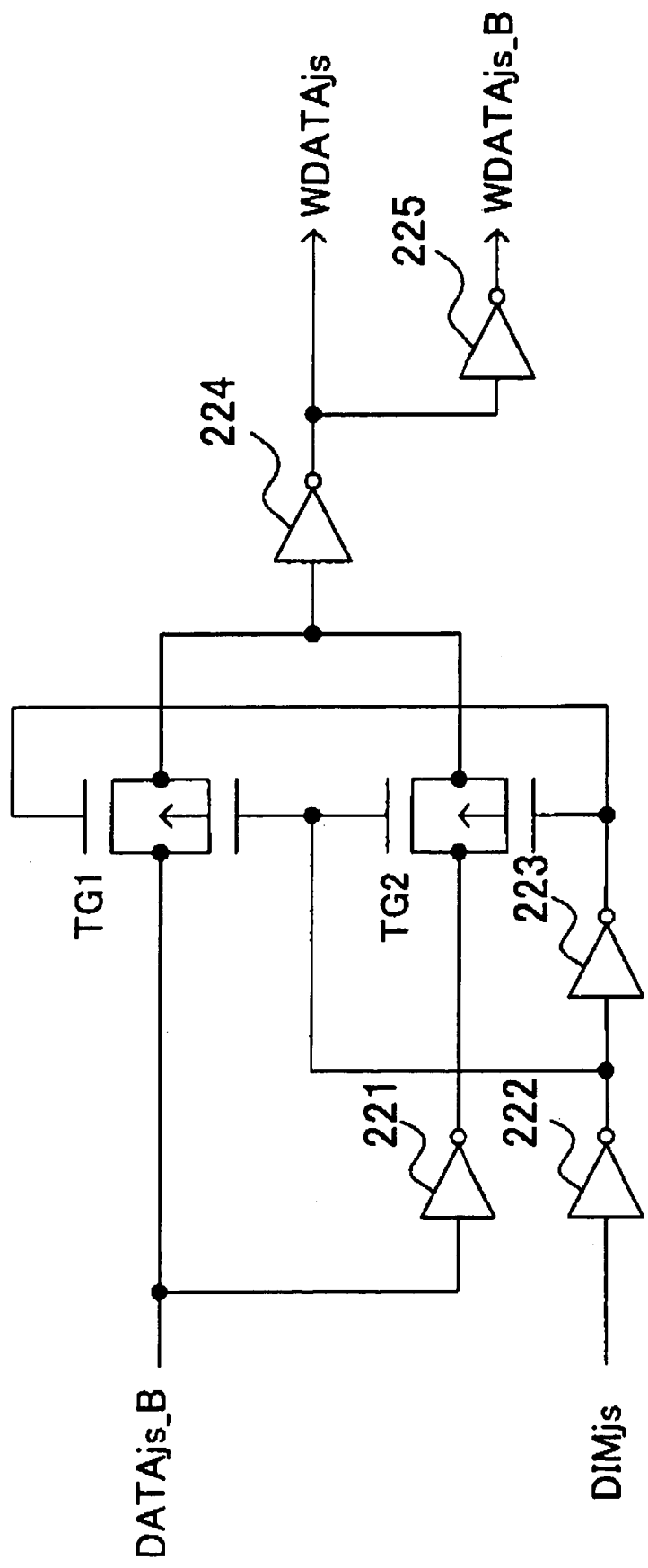
FIG. 3 shows the structure of a pre-stage circuit of the write amplifier in the embodiment of the present invention.

FIG. 3 shows the structure of an inversion controlling circuit for write data and expectation data forming a pre-stage circuit of the write amplifier (Wamp) of FIG. 2. The inversion controlling circuit, shown in FIG. 3, is included in the read/write amplifier (Ramp and Wamp) 102 shown in FIG. 1, and generates complementary data WDATAjs and WDATAjs_B of FIG. 2 to send the so generated data to the write amplifier (Wamp), while supplying write data WDATA js and WDATAjs_B as expectation data to the comparator (CCMPN). Referring to FIG. 3, this inversion control circuit is formed by a selector circuit supplied with an output signal DATAjs_B of the register 103 and an inverted signal thereof to selectively output one of these signals with DIMjs operating as a selection control signal. It is noted that j corresponds to the DQ serial number and s is a serial address in pre-fetch. 5. Specifically, the inversion control circuit includes CMOS transfer gates TG1, TG2, supplied with the output signal DATAjs_B of the write register 103 and with the signal obtained on inversion of DATAjs_B by the inverter 211. The outputs of the CMOS transfer gates TG1, TG2 are connected common and connected to an input end of an inverter 224. An output end of the inverter 224 outputs the write data WDATAjs, whilst an output end of an inverter 225, inverting WDATAjs, generates WDATAjs_B. The CMOS transfer gates TG1 and TG2 are formed by a P-channel MOS transistor and an N-channel MOS transistor and, when DIMjs is high and low, TG1 and TG2 are turned on, respectively.

Figure 4:
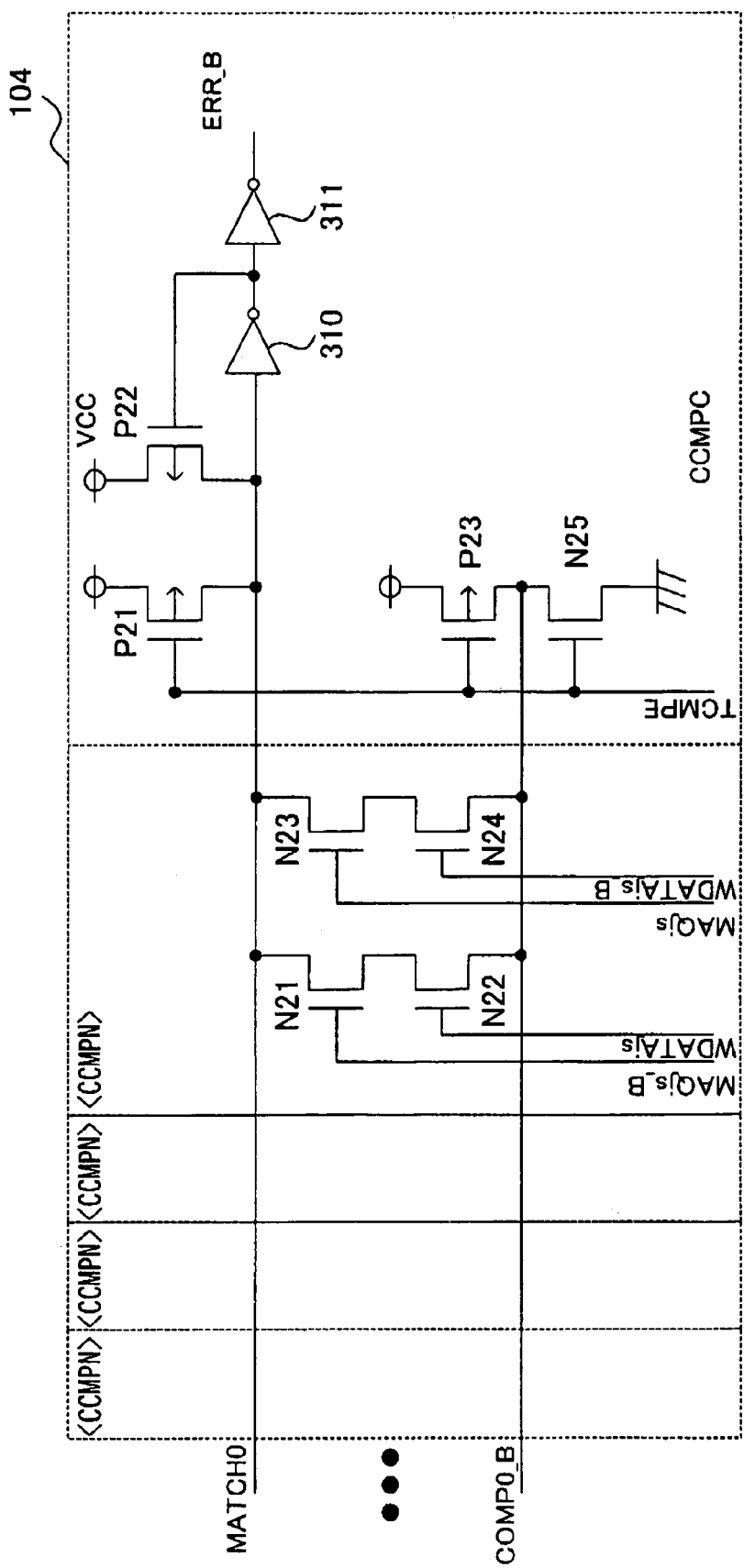
FIG. 4 shows the structure of the comparator (CCMPC) and the decision circuit (CCMPN) in the embodiment of the present invention.

FIG. 4 shows the structure and the manner of connection of the comparators CCMPN of FIG. 1 and a decision circuit (CCMPC) 104 connected common to the plural comparators. The respective comparators are connected to a common coincidence detection signal line MATCH0 and a common comparison control signal line COMP0_B. The common coincidence detection signal line MATCH0 and the common comparison control signal line COMP0_B are coupled to the decision circuit 104.

The respective comparators (CCMPN) are supplied with an output MAQjs of the read amplifier (Ramp), its complementary signal MAQjs_B, write data WDATAjs supplied to the write amplifier Wamp and its complementary signal WDATAjs_B to detect possible coincidence of the signals. That is, the comparators (CCMPN) are each provided with two N-channel MOS transistor N21, N22, connected in series across the common coincidence detection signal line MATCH0 and the common comparison control signal line COMP0_B, in which inverted read-out data MAQjs_B and non-inverted write data WDATAjs are coupled to the gates of the N-channel MOS transistor N21, N22, respectively. The comparators (CCMPN) are also each provided with two N-channel MOS transistor N23, N24 connected in series across the common coincidence detection signal line MATCH0 and the common comparison control signal line COMP0_B, in which a non-inverted readout data MAQjs and an inverted write data WDATAs_B are connected to the gates of the N-channel MOS transistor N23, N24; respectively.

In case the memory cell readout data MAQjs is coincident with the non-inverted expectation data WDATAjs (pass case), the inverted signal of the readout data MAQjs_B of the readout data is complementary with respect to the value of the expectation value data WDATAjs, while the readout data MAQjs is complementary with respect to the value of the inverted signal WDATAjs_B of the expectation data. Hence, one of the N-channel MOS transistor N21, N22 is turned off, whist one of the N-channel MOS transistor N23, N24 is turned off, so that the signal line MATCH0 and the comparison control signal line COMP0_B are not supplied with current.

If the readout data MAQjs of the memory cell is non-coincident with the non-inverted expectation data WDATAjs (fail case), the inverted signal MAQjs_B of the readout data is coincident with the value of the expectation data WDATAjs, while the readout data MAQjs is coincident with the inverted signal WDATAjs_B of the expectation data. As typical of the case of failure, when a high level data is written as write data in a memory cell and the expectation value data WDATAjs is in a high level, the readout data MAQjs from the memory cell is in a low level, the inverted signal of the readout data MAQjs_B is in a high level, and the N-channel MOS transistor N21, N22 are both turned on, so that the signal line MATCH0 and the comparison control signal line COMP0_B are both supplied with current. If low level data is written as write data in the memory cell, and the expectation data WDATAjs is low (expectation value WDATAjs_B is high), the readout data MAQjs from the memory cell goes high, so that the N-channel MOS transistor N23, N24 are both turned on and hence the signal line MATCH0 and the comparison control signal line COMP0_B are both supplied with current.

That is, when the readout data from the read amplifier is non-coincident with the expectation data, the series circuit of the N-channel MOS transistor N21, N22 or the series circuit of the N-channel MOS transistor N23, N24 is supplied with current, so that the signal line MATCH0 and the comparison control signal line COMP0_B are supplied with current. The same may be said of the other comparators CCMPN.

The decision circuit (CCMPC) 104 includes a P-channel MOS transistor P21, having a source connected to the power supply VCC, having a drain connected to the coincidence detection signal line MATCH0 and having a gate connected to the test compare enable signal TCMPE, controlling the activation of the comparison operation, a P-channel MOS transistor P22, having a source connected to the power supply, having a drain connected to the coincidence detection signal line MATCH0 and having a gate connected to an output of an inverter 310, a P-channel MOS transistor P23, having a source connected to the power supply VCC, having a drain connected to COMP0_B and having a gate connected to the test compare enable signal TCMPE, and an n-channel MOS transistor N25, having a source connected to GND, having a drain connected to COMP0_B and having a gate connected to the test compare enable signal TCMPE.

The coincidence detection signal line MATCH0 is connected to an input end of the inverter 310, an output of which is coupled to the gate of the P-channel MOS transistor P22 and issued via inverter 311 as an error flag ERR_B (represents failure at a low level).

The operation of the circuit shown in FIG. 4 is explained. During the time the test compare enable signal TCMPE is low, the P-channel MOS transistors P21, P23 are turned on, such that the coincidence detection signal line MATCH0 and the common comparison control signal line COMP0_B are pre-charged to the power supply potential (high level). An output of the inverter 310, supplied with the coincidence detection signal MATCH0, goes low, with the error flag ERR_B going high. The P-channel MOS transistor P21 is also turned on to pull up the coincidence detection signal line MATCH0 to the power supply potential.

If, during testing, the test compare enable signal TCMPE goes high, the N-channel MOS transistor N25 is turned on, with the signal line COMP0_B being at a low level.

If, as a result of comparison in the comparator (CCMPN), the readout data from the associated read amplifier (Ramp) is not coincident with the expectation data, the signal line MATCH0 and the comparison control signal line COMP0_B are supplied with current, with the signal line MATCH0 being discharged to a potential equal to the ground potential.

When the signal line MATCH0 goes low, an output of the inverter 310 goes high, with the error flag ERR_B going low. That is, the 'fail' is output.

If non-coincidence between the readout data and the expectation data is detected in one or more of plural comparators (CCMPN), the error flag ERR_B goes low. Meanwhile, the number of the comparators (CCMPN) may be optionally set depending on the scale (number) of the parallel circuits.

Figure 5:
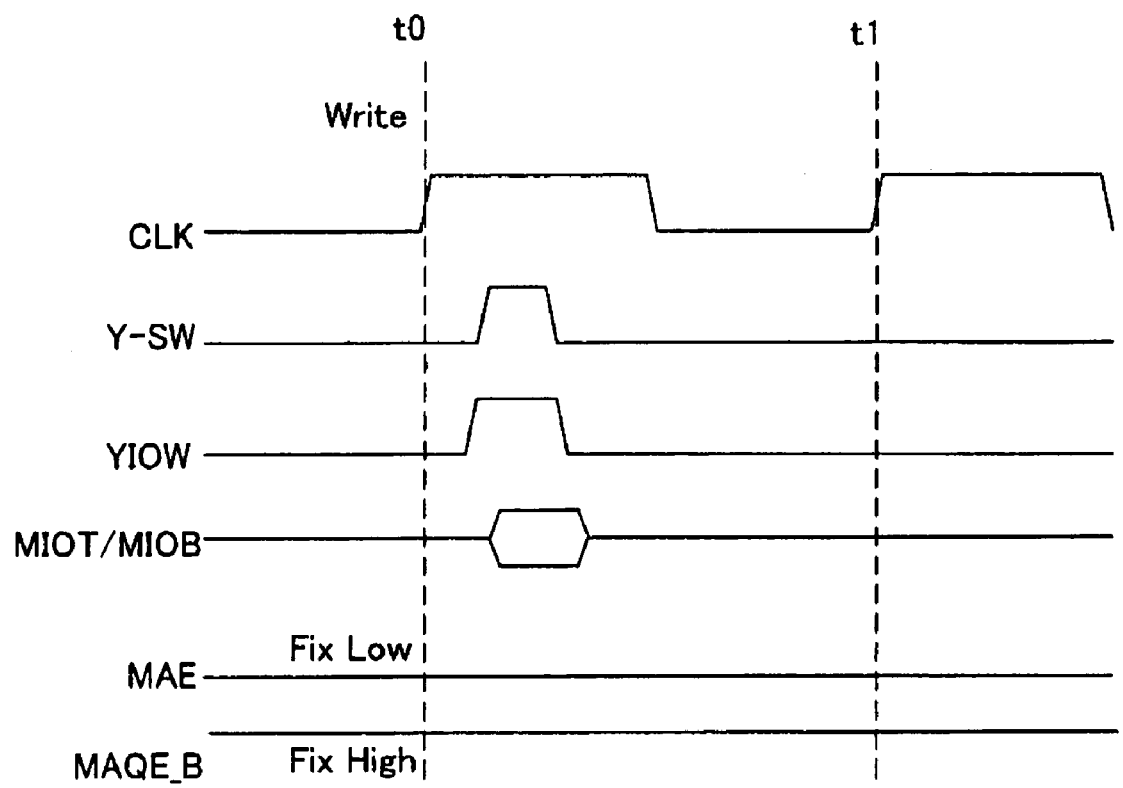
FIG. 5 is a waveform diagram for illustrating the write operation of a parallel test mode in the embodiment of the present invention.

FIG. 5 is a waveform diagram for illustrating the write operation in the parallel test mode in the present embodiment. In FIG. 5, CLK is an internal clock synchronized with the clock supplied from outside a clock synchronization type semiconductor storage device. Y-SW is a control signal for enabling a Y-switch, not shown, and is output as a one-shot pulse. During the high level period of the one-shot pulse, the paired IO lines MIOT and MIOB are connected to the selected bit line. YIOW is a write enable signal and, responsive to the high level of this signal, the write amplifier (Wamp) outputs write data WDATA, WDATA_B to the paired IO lines MIOT and MIOB. The read amplifier enable signal MAE is in a non-activated state.

Figure 6:
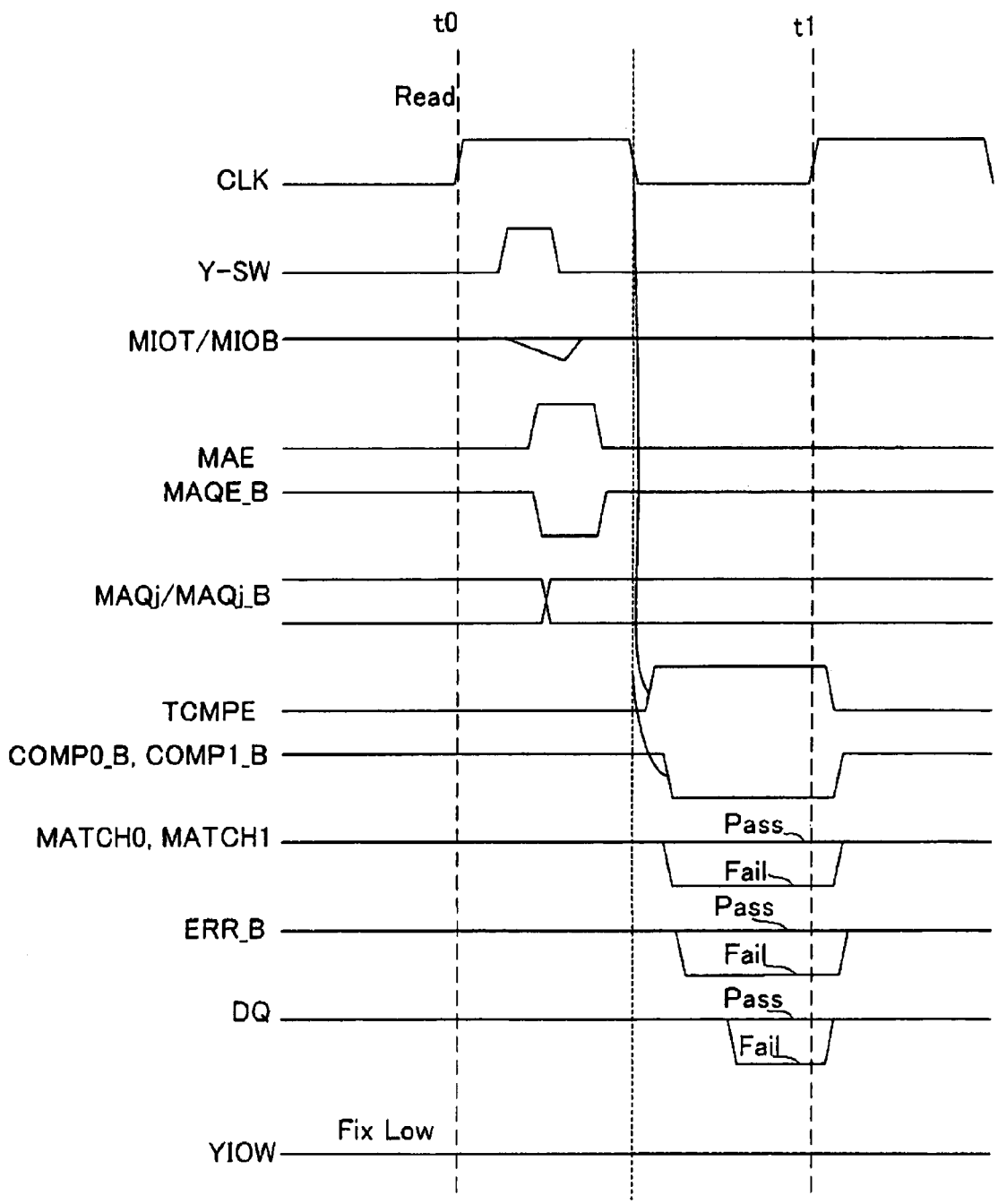
FIG. 6 is a waveform diagram for illustrating the read operation of a parallel test mode in the embodiment of the present invention.

FIG. 6 illustrates the read operation in the parallel test mode in the present embodiment. CLK is an internal clock synchronized with clocks supplied from outside the clock synchronization type semiconductor storage device. Y-SW is a control signal for enabling a Y-switch, not shown, and is output as a one-shot pulse. During the high level period of the signal Y-SW, the potential on the precharged IO lines MIOT and MIOB is opened by an output of a sense amplifier 101-3. Responsive to the high level of the read amplifier enable signal MAE, the readout data pair MAQjs/MAQjs_B, output from the read amplifier (Ramp) are in the high/low levels. Responsive to a falling edge of the clock CLK, the one-shot pulse TCMPE (test compare enable signal) is output. The signal line COMP0_B is at the ground potential. As a result of comparison in the comparator (CCMPN), the signal line MATCH0 is at a high or a low level and the value of the error flag is determined and output at an associated data terminal (DQ terminal). In FIG. 6, COMP1_B and MATCH1 represent signal lines of a second channel and will be explained later with reference to FIGS. 11 and 12. YIOW is a write enable signal and is fixed at a low level. The error flag ERR_B is output from the output terminal DQ of the semiconductor device. The error flag ERR_B may be compressed in the second and third stages. That is, one or plural stages of the coincidence detection circuit may be provided and supplied with plural error flags ERR_B.

Figure 7:
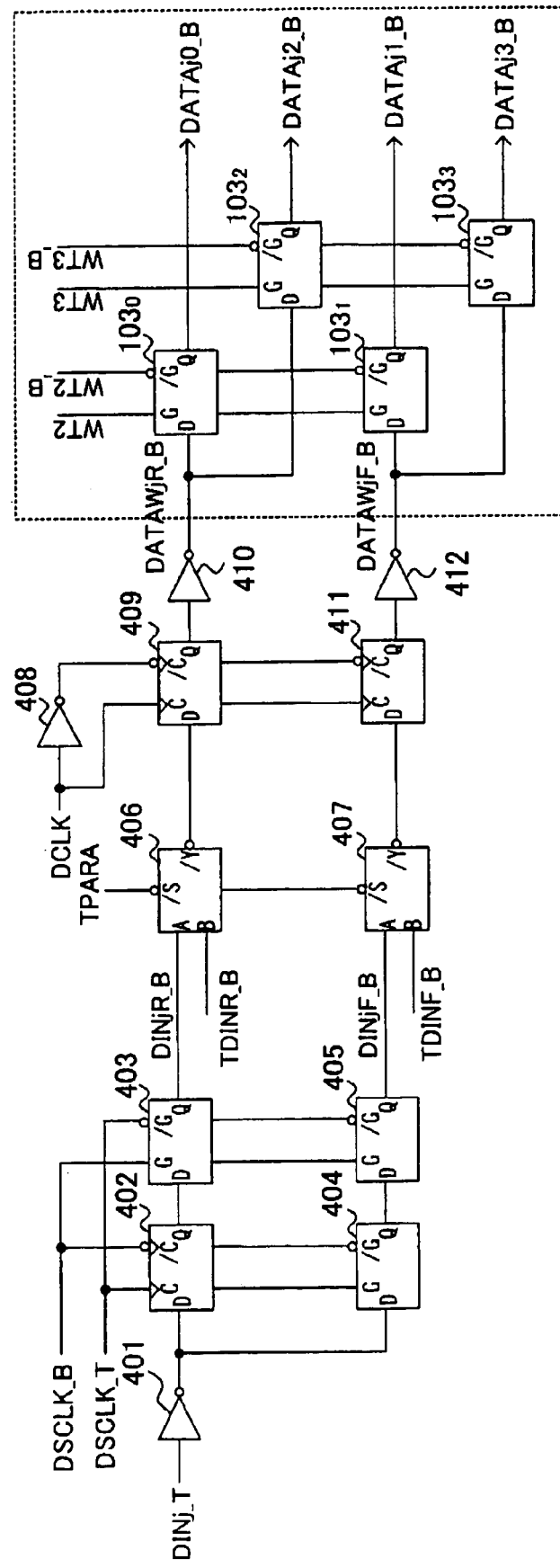
FIG. 7 shows the structure of a write register in the embodiment of the present invention.

FIG. 7 shows an illustrative structure of a write register of a clock synchronization type semiconductor storage device embodying the present invention. There is shown a portion of a data inputting circuit of a DDR type SDRAM including a data terminal DQ supplied with two data using a rising edge and a falling edge of one clock cycle.

In FIG. 7, four registers 1030, 1031, 1032 and 1033 correspond to four write registers, supplied e.g. with DATAj0_B, DATAj1_B, DATAj2_B and DATAj3_B, in the configuration shown in FIG. 1. Meanwhile, the input and the output of the write register 103 are represented by the same DATAjs_B (s=0 to 3). In the present case, the write registers are each composed by a level sensitive latch. When the sampling control signal terminal G is in the high level (/G terminal is in the low level), the input is output in 'through'. When the terminal G is in the low level, the value stored when G is in the high level is output. Meanwhile, in FIG. 7, in which edge trigger registers 409, 411 are provided in the former stage, the registers 1030, 1031, 1032 and 1033 are formed by 'through' latches. However, these registers may, of course, be formed the edge trigger registers.

The non-inverted data input DINj_T of the data terminal DQ is inverted by an inverter 401 and supplied via a register 402 and a latch 403 to a multiplexer 406. An output of the inverter 401 is entered via level sensitive latches 404, 405 to a multiplexer 407. The register 402 is formed e.g. as a positive edge trigger register circuit and is made up by a master latch and a slave latch. When the lock signal C is in the low level, the input data is stored by the master latch and, when the clock signal C is in the high level, the data stored in the master latch is output from a slave latch and stored.

DINj_T is data entered to the j'th DQ terminal twice during one clock cycle of the clock CLK, in synchronism with the rising and falling edges thereof, such that four data D[0], D[1], D[2] and D[3] are serially entered in two clock cycles.

The registers 402, 403 and latches 404, 405 represent a serial-to-parallel converter circuit (demultiplexer) for expanding the serial data in two phases, and perform serial-to-parallel conversion of two data D[0], D[1], serially entered during one clock cycle from the data terminal DQ, into parallel data, to output D[0], D[1] as parallel data during one clock cycle. The complementary clocks DSCLK_T and DSCLK_B are inner signals of a data strobe signal DQS. The structure of the two-phase expanding circuit (serial-to-parallel converter circuit), made up by the registers 402, 403 and the latches 404, 405, is known per se.

A multiplexer (selector) 406 is supplied with one DINjR_B of two phase signals expanded from the input data DINj_T from the DQ terminal, and with a signal TDINR_B entered from the preset data terminal DQ during the test mode, and outputs DINjR_B and TDINR_B, during the normal operation and during parallel testing, based on a parallel test signal TPARA, respectively. An output of the multiplexer 406 is supplied to a register 409 and inverted by an inverter 410 so as to be supplied as a signal DATAWjR_B to data terminals of write registers 1030, 1032.

The multiplexer 407 is supplied with one DINjF_B of the two phase signals, obtained on two-phase expansion of DINj_T, and with a signal TDINF_B, entered from the preset data terminal DQ during the test mode, and outputs DINjF_B and TDINF_B during the normal operation and during parallel testing, based on the signal TPARA, respectively. An output of the multiplexer 407 is entered to a register 411 and inverted by an inverter 412 so as to be supplied as signal DATAWjF_B to data terminals of write registers 1031, 1033.

The write registers 1030, 1031 are supplied with a write pulse WT2, while the write registers 1032, 1033 are supplied with a write pulse WT3. These write pulses WT2, WT3 are generated in the inside of the semiconductor storage device.

The output terminals Q of the write registers 1030, 1031, 1032, 1033 output DATAj0_B, DATAj1_B, DATAj2_B, DATAj3_B, respectively. It should be noted that, in FIG. 1, the inputs of the four write registers (W·R) 103 are represented in association with the respective output signals DATAj0_B, DATAj1_B, DATAj2_B, DATAj3_B for simplicity.

Figure 8:
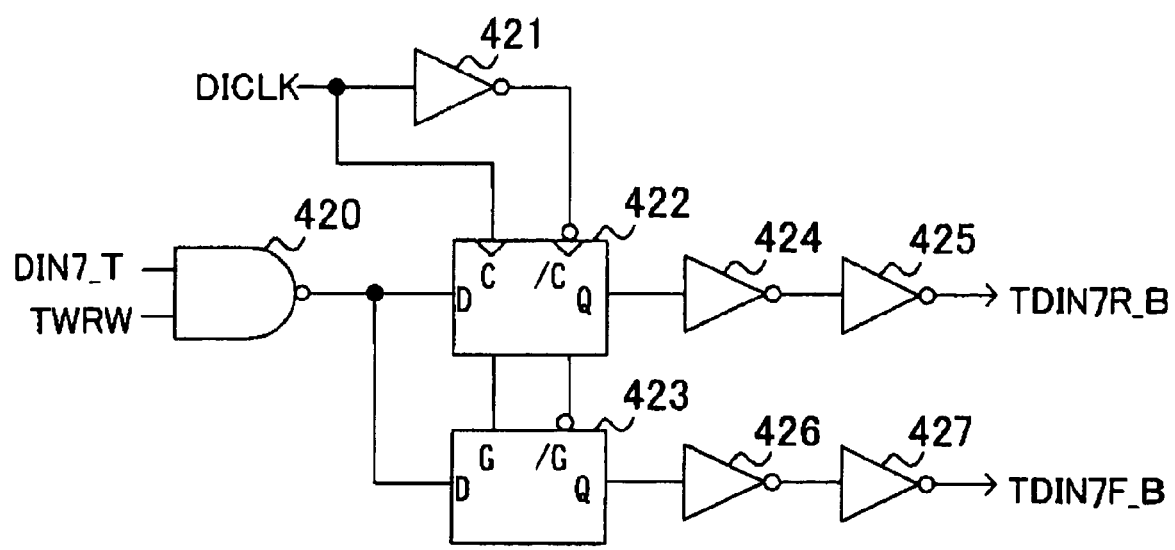
FIG. 8 shows the structure of a write register in the embodiment of the present invention.

FIG. 8 shows an example of a circuit for generating test data TDIN7R_B, TDIN7F_B entered to the multiplexers 406, 407. This circuit includes a NAND circuit 420, supplied with data DIN7_T from a seventh DQ terminal (DQ7) and with a write register write test mode signal TWRW, an edge trigger register (master-slave latch) 422, supplied with an inner clock for write DICLK, as clock signal, and a level sensitive latch 423. The inner clock for write DICLK is generated within the semiconductor storage device by delaying the inner clock CLK (clock signal synchronized with the clock signal from the external clock terminal). The two-phase signals, obtained on expanding the input data DIN7_T, are output from the output terminals Q of the register 422 and the latch 423 through inverters 424 to 427. In case the write register write test mode signal TWRW is low, the NAND circuit 420 outputs a fixed high value without dependency on the value of the input data DIN7_T.

According to the present invention, the write registers 103 for pre-fetch perform the write operation for the normal mode and for the test mode, and the operation for supplying the expectation data. An example of the write operation during the normal mode (usual operation) and the write operation during the test mode is now explained.

Figure 9:
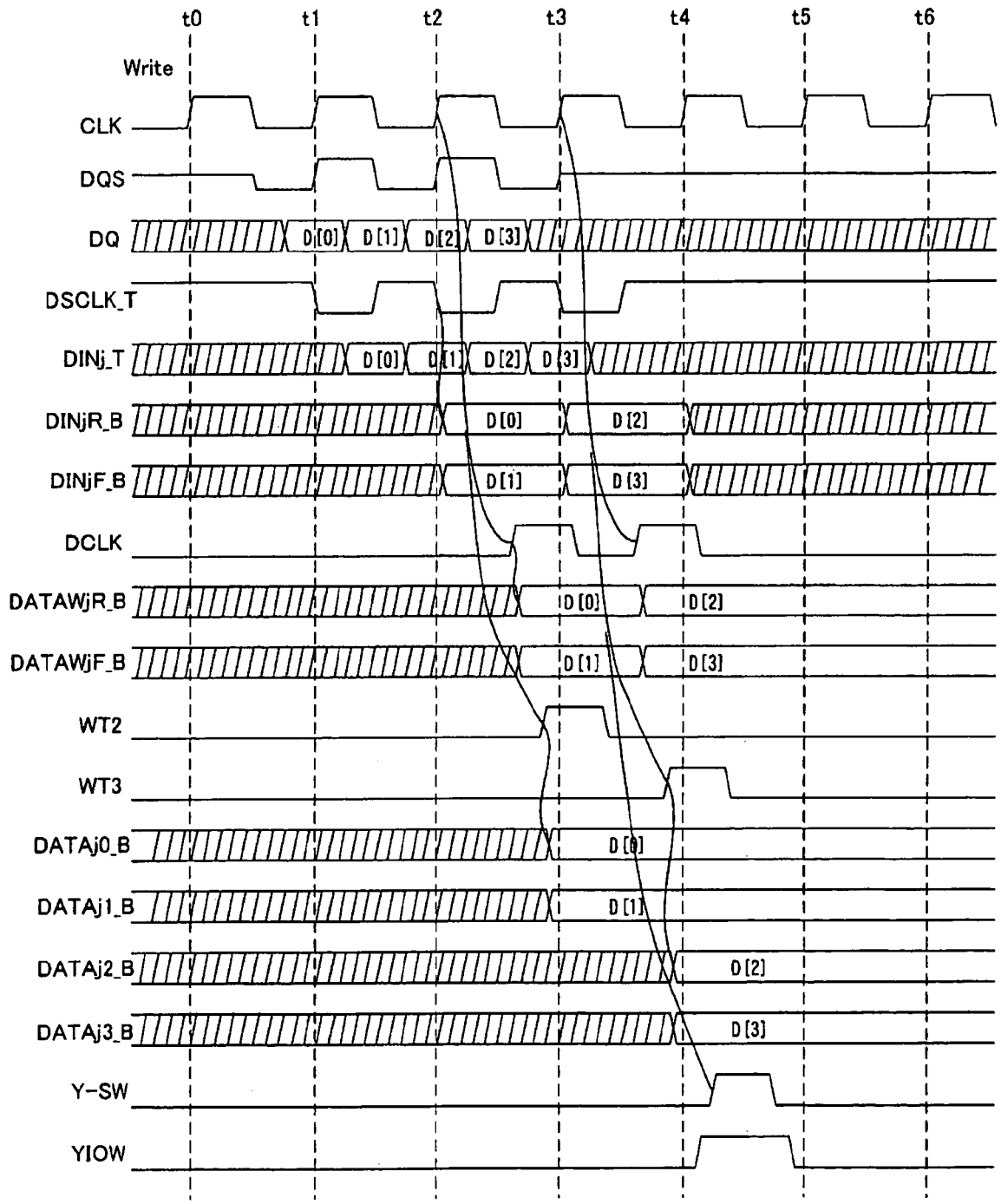
FIG. 9 is a waveform diagram for illustrating the write operation in the normal mode in the embodiment of the present invention.

FIG. 9 is a timing diagram for illustrating the write operation for the normal mode, and is to be used for understanding the operation of the circuit of FIG. 7 (pre-fetch operation of the DDR SDRAM).

In FIG. 9, CLK is a clock signal (inner clock signal synchronized with a clock signal supplied from outside). DQS and DQ denote a data strobe signal and a data input/output terminal, respectively. DSCLK_T/DSCLK_B is an inner signal of the data strobe signal DQS and is supplied as a clock signal for the registers 402 and the latches 403 to 405 of FIG. 7. DINj_T is an input from the j'th DQ terminal, whilst DINjR_B, DINjF_B are two-phase signals, output from the latches 403, 404 of FIG. 8. DCLK is an inner clock signal for write, whilst DATAWjR_B and DATAWjF_B are data signals supplied to the write register. WT2, WT3 are sampling clocks (one-shot pulses) supplied to the write register. DATAj0_B to DATAj3_B are outputs of the write register, Y-SW is a control signal for turning a Y-switch on and YIOW is a write enable signal for the write amplifier.

Referring to FIG. 9, the schematics of the write operation for the write register during the normal operation are now explained. The write operation commences at a cycle t0 and two data are serially entered during one clock cycle using the rising and falling edges of each clock. At a cycle t2, signals expanded in two phases D[0], D[1] are output from the two-phase expanding circuit (outputs of the latches 403, 404 of FIG. 7) as DINjR_B, DINjF_B. At a cycle t3, signals expanded in two phases D[2], D[3] are output from the two-phase expanding circuit (outputs of the latches 403, 404 of FIG. 7). The multiplexers 406, 407 select and output DINjR_B, DINjF_B. The registers 409, 410 sample DINjR_B, DINjF_B with the rising edge of the clock CLK to output DATAkWjR_B, DATAkWjF_B. The write registers 1030, 1031, supplied with DATAkWjR_B, DATAkWjF_B, receive one-shot pulses (high level) of the write pulse WT2 to output D[0], D[1], while the write registers 1032, 1033, supplied with DATAkWjR_B, DATAkWjF_B, receive one-shot pulses (high level) of the write pulse WT3, with a delay of one clock cycle, to output D[2], D[3]. Responsive to the one-shot pulse of the Y-switch Y-SW and the one-shot pulse of YIOW, data are written in the memory cell of the selected word line of the memory cell array 101-1.

Figure 10:
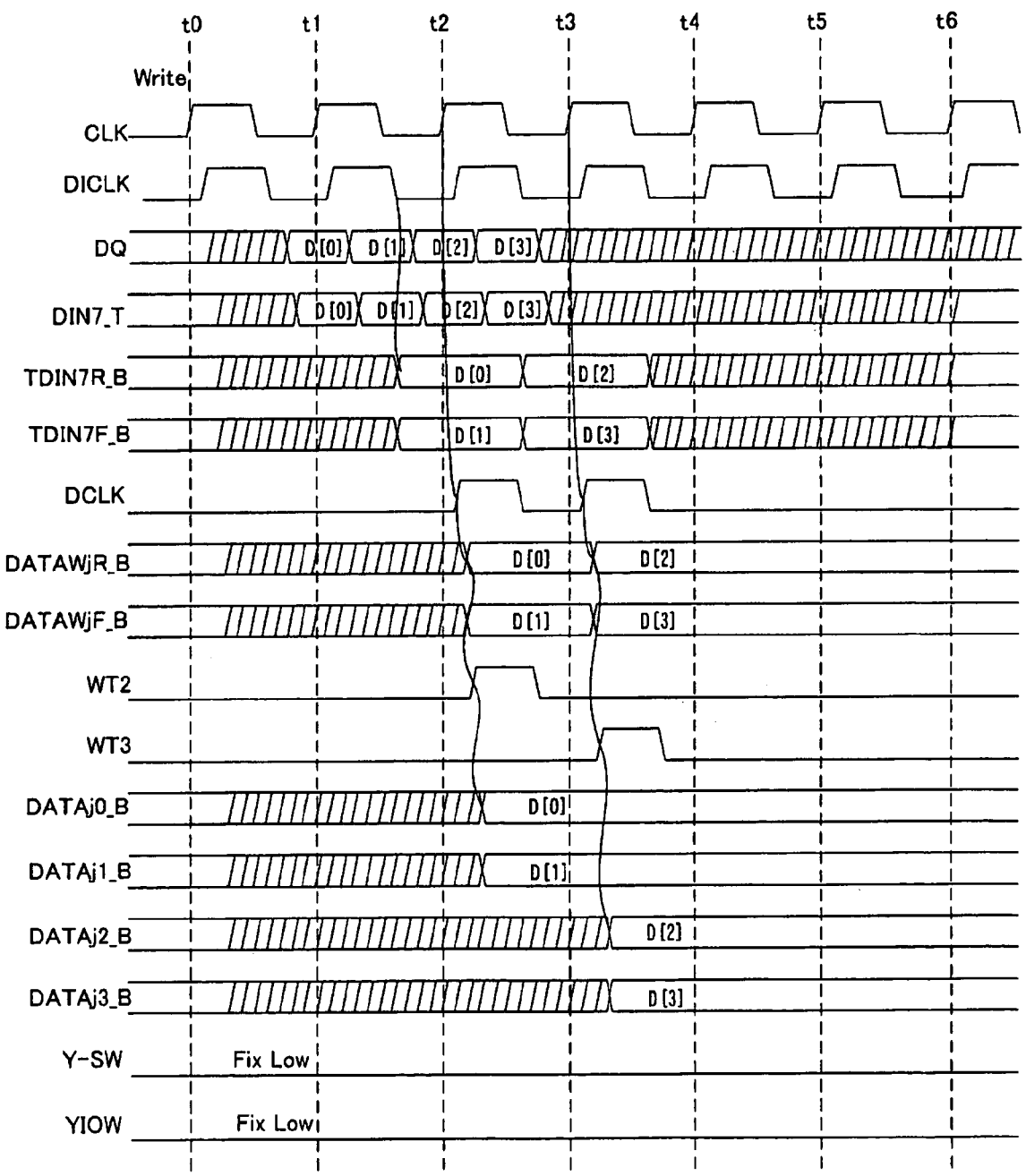
FIG. 10 is a waveform diagram for illustrating the write mode in the write register in the embodiment of the present invention.

FIG. 10 shows an example of the operation of the write mode in the write register 103 during testing (parallel test). During writing in the write register 103 during the test mode, the data strobe signal DQS is not used. The register latching input data uses DICLK signal, which is a delayed version of the clock signal CLK, and data from one data input terminal DQ7 for inputting test data are sampled at the initial stage register 422 and latch 423. The reason is that, in a wafer test or a batch processing test (burn-in), the test cycle is slow and the timing conditions are moderate and hence the tests are conducted with a smaller number of pins (tester pin count). In the write register write mode, the signals YIOW and YSW are both in the inactivated state. When the write register write test mode signal TWRW is high, the data DIN7_T from the data input terminal DQ7 is expanded in two phases, by the register 422 and the D-latch 423, in synchronism with the clock signal DICLK, such that, as TDIN7R_B and TDIN7F_B, D[0] and D[1] are output and, at the falling of the next DICLK, D[2] and D[3] are output.

The multiplexers 406, 407 (see FIG. 7) select TDIN7R_B, TDIN7F_B and output DATAWjR_B DATAWjF_B in synchronism with DCLK. The write registers 1030, 1031 supplied with DATAkWjR_B, DATAkWjF_B receive the high level pulse of the write pulse WT2 to output D[0] and D[1], whilst the write registers 1032, 1033, supplied with DATAk-WjR_B, DATAkWjF_B, receive the high level of the write pulse WT3, with a delay of one clock cycle, to output D[2] and D[3].

The data writing to the memory cell from the write amplifier (Wamp), following the writing of the data in the write register 103, is carried out by the operation shown in FIG. 5. In the present embodiment, test data is written in the write register (W·R), during the test (parallel test), in accordance with the write mode, an exemplary operation for which is shown in FIG. 10. The test data or an inverted version thereof is then selected, based on an inversion control signal (DIM), and routed as write data for the memory cell and as expectation data to a comparator. Thus, if the inverted value of the test data is to be the write data, the cycle of writing the inverted value of the test data in the write register (W·R) is unneeded. That is, if, in the test device for testing the semiconductor storage device of the present embodiment, a pattern of changing the value of the inversion control signal (DIM) is applied to the semiconductor storage device, it is possible to dispense with the test vector corresponding to the cycle of writing the inverted version of the test data in the write register (W·R).

Figure 11:
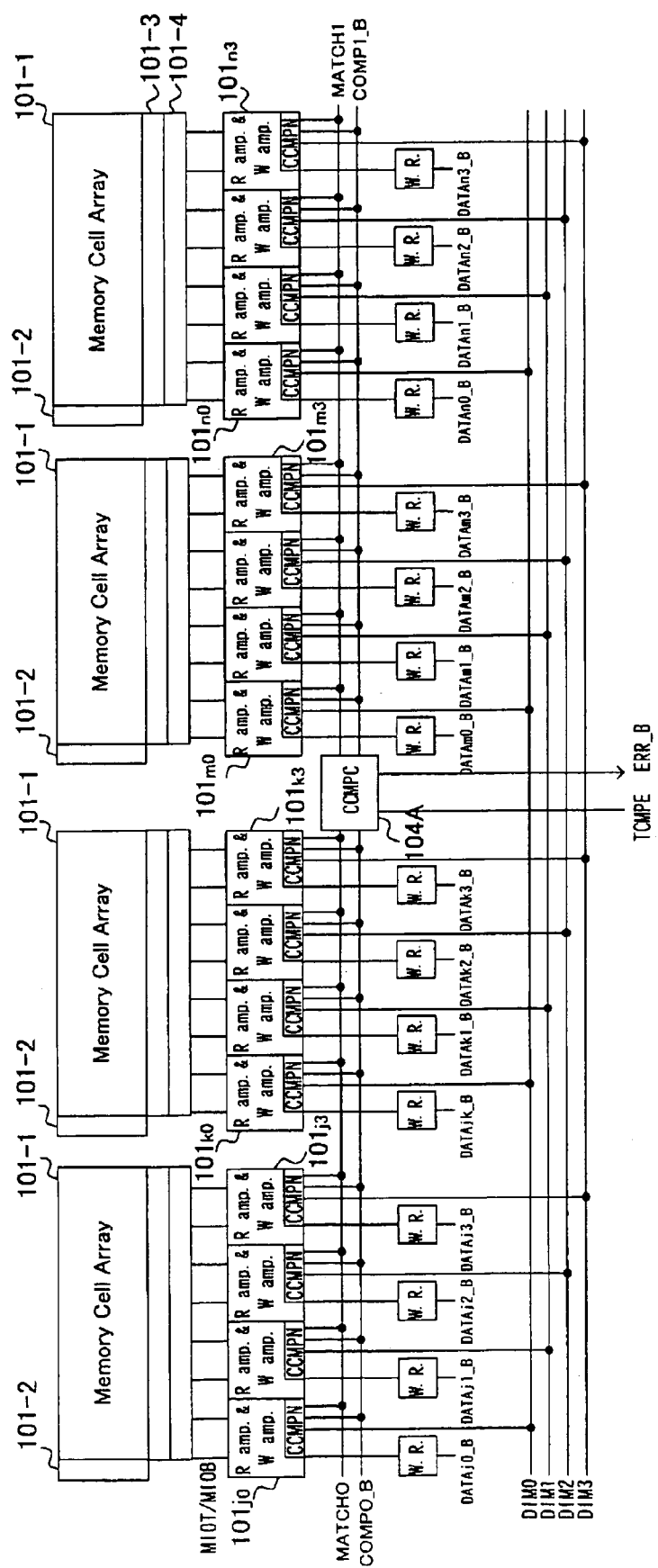
FIG. 11 shows the structure of a modified embodiment of the present invention.

Another embodiment of the present invention is now explained. FIG. 11 shows two channels of the coincidence detection signal line MATCH for a decision circuit 104A. The decision circuit 104A is provided for plural memory cell arrays 101-1 on both sides of the decision circuit 104A and there are provided two channels of the coincidence detection signal line MATCH of a left side signal line MATCH0 and COMP0_B and a right side signal line MATCH1 and COMP1_B. The decision circuit 104A is connected to each of the MATCH0, COMP0_B, MATCH1 and COMP1_B.

The structure including each four read/write amplifiers (Ramp and Wamp), comparators (CCMPN) and write registers 103 for the memory cell array 101-1 (that is, for one DQ terminal) is similar to the structure of FIG. 1. That is, the structure is similar to that of FIG. 1 except that the decision circuit 104A is used in common and the respective components are arrayed symmetrically around the decision circuit 104A.

With the structure of the present embodiment, the wiring length of the signal lines MATCH0, MATCH1 is shortened to reduce the load capacity as well as the wiring resistance to improve the delay characteristics.

Figure 12:
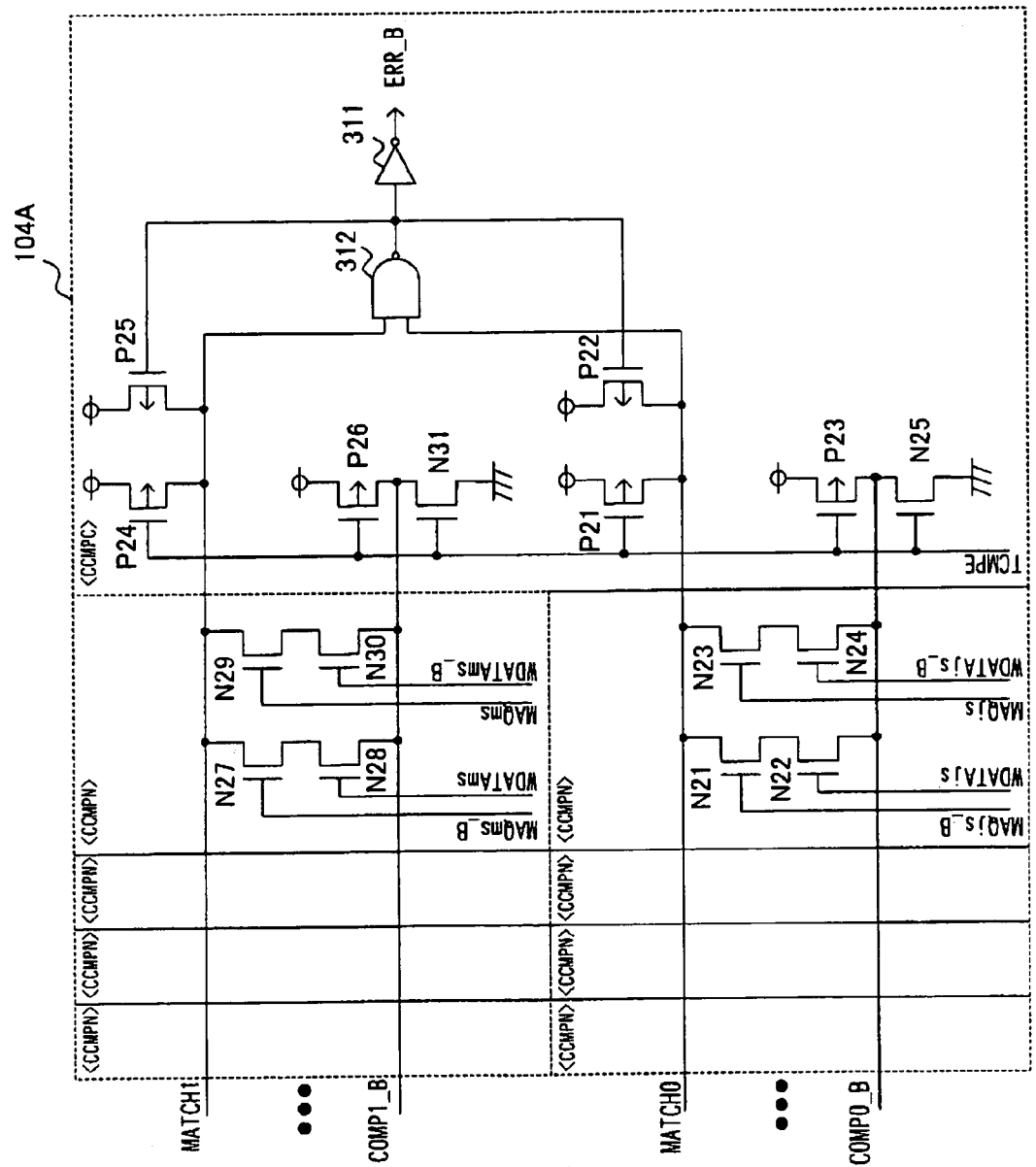
FIG. 12 shows the structure of the comparator (CCMPC) and the decision circuit (CCMPN) in the modified embodiment of the present invention.
Figure 13:
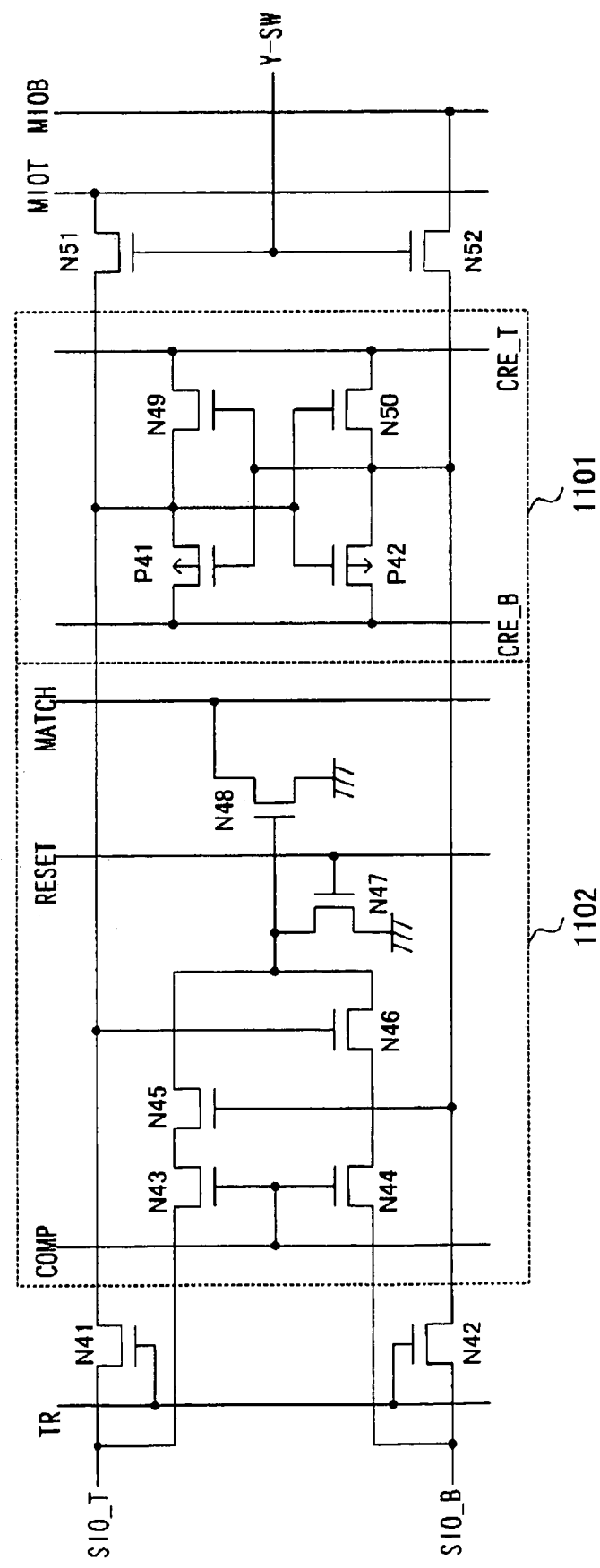
FIG. 13 shows an example of a conventional test circuit for a semiconductor storage device.
Figure 14:
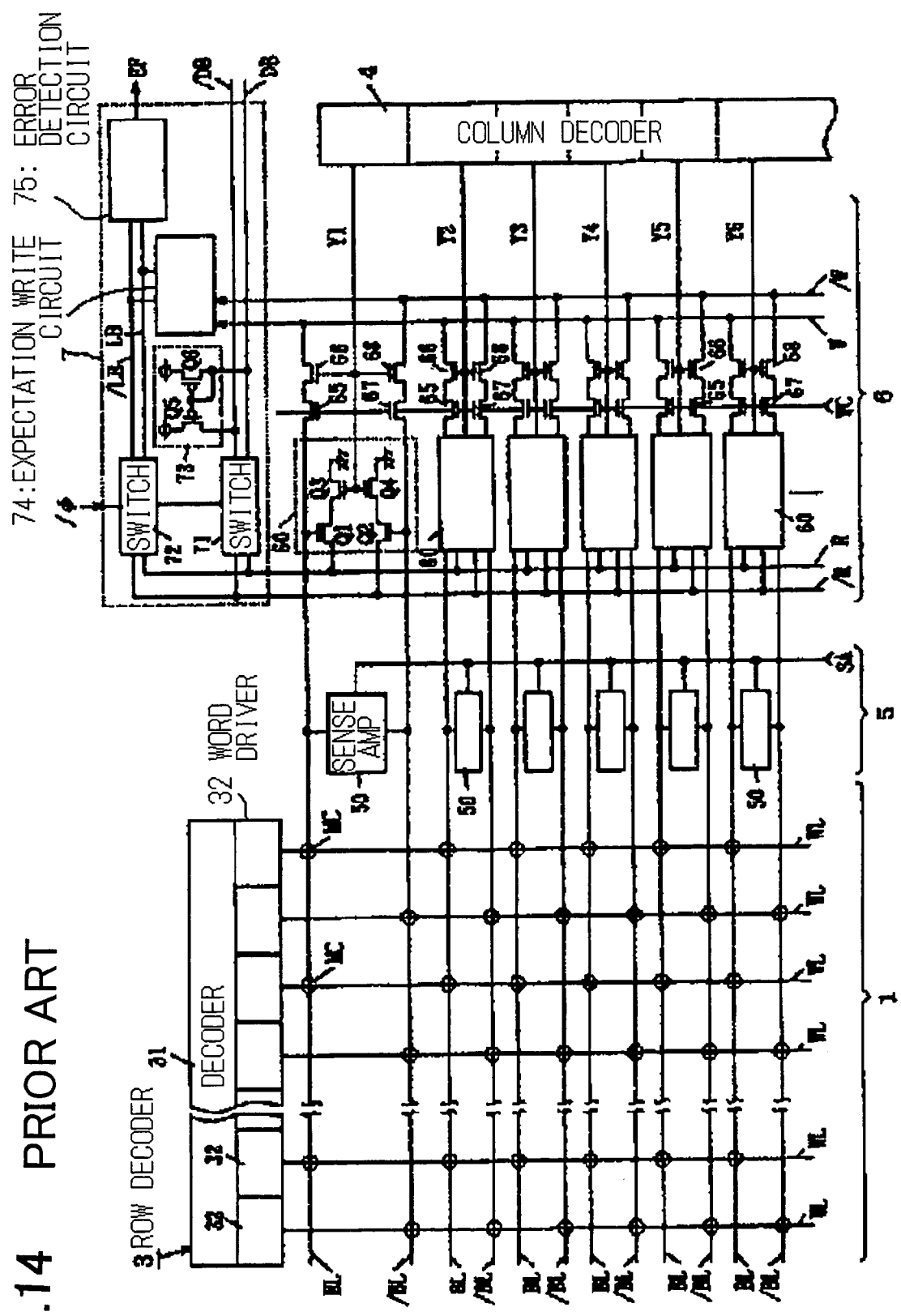
FIG. 14 shows an example of a conventional test circuit for a semiconductor storage device.
Figure 15:
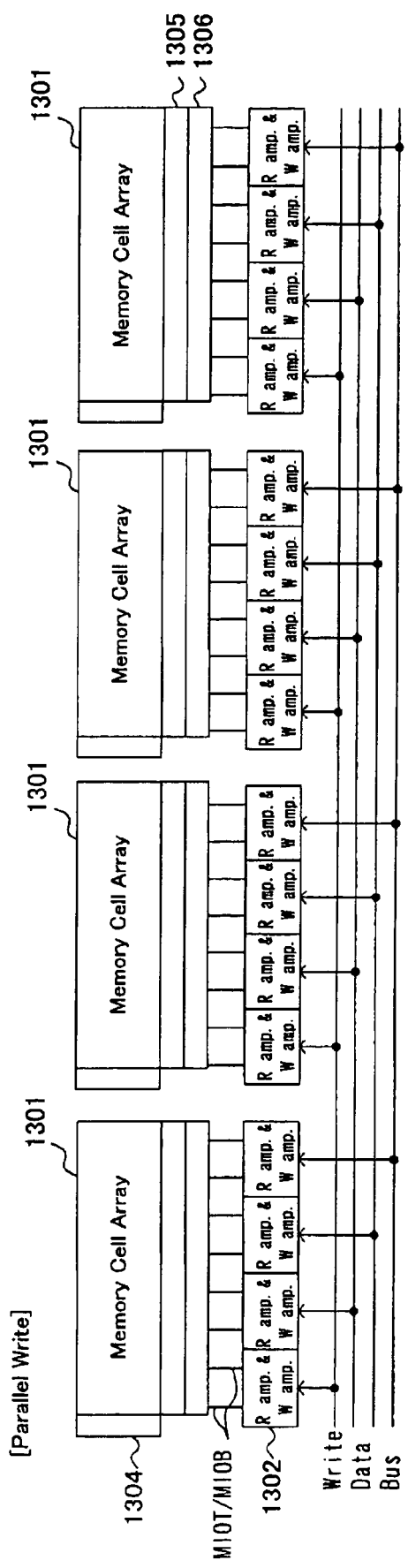
FIG. 15 shows an example of a conventional test circuit for a semiconductor storage device.

FIG. 12 shows the structure of the comparator (CCMPN) of FIG. 11 and the decision circuit 104A and the connection configuration. A first set (first channel) of the comparators (CCMPN) are connected to a common coincidence detection signal line MATCH0 and to a common comparison control signal line COMP0_B. The common coincidence detection signal line MATCH0 and the common comparison control signal line COMP0_B, in turn, are connected to the decision circuit 104A.

A second set (second channel) of the comparators (CCMPN) are connected to a common coincidence detection signal line MATCH1 and a common comparison control signal line COMP1_B. The common coincidence detection signal line MATCH1 and the common comparison control signal line COMP1_B, in turn, are connected to the decision circuit 104A.

The first set of the comparators (CCMPN), connected to the common coincidence detection signal line MATCH0 and to the common comparison control signal line COMP0_B, are of the same structure as the comparator CCMPN shown in FIG. 4. That is, the comparator is supplied with readout data MAQ, an inverted version thereof MAQ_B, output from the read amplifier (Ramp), write data WDATA, supplied to the write amplifier (Wamp) and with an inverted version thereof WDATA_B, as expectation values, to detect whether or not the readout data coincides with the expectation data.

The second set of comparators (CCMPN) includes two N-channel MOS transistors N27, N28, connected in series across the coincidence detection signal line MATCH1 and the comparison control signal line COMP1_B. The gates of the N-channel MOS transistors N27, N28 are connected to inverted readout data MAQms_B and non-inverted write data WDATAms, respectively. The second set of comparators also includes two N-channel MOS transistors N29, N30, connected in series across the coincidence detection signal line MATCH1 and the comparison control signal line COMP1_B. The gates of the N-channel MOS transistors N29, N30 are connected to non-inverted readout data MAQms and inverted write data WDATAms_B, respectively.

When the readout data MAQms of the memory cell coincides with the non-inverted expectation data WDATAms (pass case), the inverted version of the readout data MAQms_B and the expectation data WDATAms are complementary to each other, while the readout data MAQms and the inverted version of the expectation data WDATAms_B are complementary to each other. The result is that one of the N-channel MOS transistors N27, N28 is turned off, so that the signal line MATCH1 and the common comparison control signal line COMP1_B become non-conductive.

When the readout data MAQms of the memory cell is not coincident with the non-inverted expectation data WDATAms (fail case), the inverted version of the readout data MAQms_B and the expectation data WDATAms are coincident with each other, while the readout data MAQms and the inverted version of the expectation data WDATAms_B are coincident with each other. As an example of the failure, if the high level is written in the memory cell as the write data WDATAms, and the expectation data WDATAms is high, the readout data from the memory cell MAQms is low, whilst the inverted signal of the readout data MAQms_B is high, so that the N-channel MOS transistors N27, N28 are both turned on, with the signal line MATCH1 and the common comparison control signal line COMP1_B becoming current conductive (the signal line MATCH1 being at the ground potential). On the other hand, if the low level is written in the memory cell as the write data WDATAms, and the expectation data WDATAms is low (the expectation data MAQms_B being high), the readout data MAQms from the memory cell is high, so that the N-channel MOS transistors N29, N30 are both turned on, with the signal line MATCH1 and the common comparison control signal line COMP1_B becoming current conductive.

That is, when the readout data from the read amplifier is not coincident with the expectation data, one of the series circuit of the N-channel MOS transistors N27, N28 and the series circuit of the N-channel MOS transistors N29, N30 is current conductive, with the signal line MATCH1 and the common comparison control signal line COMP1_B becoming current conductive. The same may be said of the other comparators (CCMPN).

The decision circuit (CCMPC) 104A includes, as the circuit connecting to the signal line MATCH0 and to the signal line COMP0_B of a first channel, a P-channel MOS transistor P21, having a source connected to the power supply VCC, having a drain connected to the coincidence detection signal line MATCH0 and having a gate connected to the test compare enable signal TCMPE, a P-channel MOS transistor P22, having a source connected to the power supply, having a drain connected to the coincidence detection signal line MATCH0 and having a gate connected to an output of the NAND circuit 312, a P-channel MOS transistor P23, having a source connected to the power supply, having a drain connected to COMP0_B and having a gate connected to the test compare enable signal TCMPE, and an N-channel MOS transistor N25, having a source connected to GND, having a drain connected to COMP0_B and having a gate connected to the test compare enable signal TCMPE. The decision circuit (CCMPC) 104A also includes, as the circuit connecting to the signal line MATCH1 and to the signal line COMP1_B of a second channel, a P-channel MOS transistor P24, having a source connected to the power supply VCC, having a drain connected to the coincidence detection signal line MATCH1 and having a gate connected to the test compare enable signal TCMPE, a P-channel MOS transistor P25, having a source connected to the power supply, having a drain connected to the coincidence detection signal line MATCH1 and having a gate connected to an output of the NAND circuit 312, a P-channel MOS transistor P26, having a source connected to the power supply, having a drain connected to the comparison control signal line COMP1_B and having a gate connected to the test compare enable signal TCMPE, and an N-channel MOS transistor N31, having a source connected to the ground GND, having a drain connected to COMP1_B and having a gate connected to the test compare enable signal TCMPE The decision circuit (CCMPC) 104 includes a NAND circuit 312, having two input ends connected to the coincidence detection signal line MATCH0 of the first channel and with the coincidence detection signal line MATCH1 of the second channel, and an inverter 311, an input end of which is connected to an output end of the NAND circuit 312 and an output end of which outputs an error flag signal ERR_B which is in a low level at the time of 'fail' decision. An output end of the NAND circuit 312 is connected to the gates of the P-channel MOS transistors P22, P25. When an output end of the NAND circuit 312 is low ('pass' case), the P-channel MOS transistors P22, P25 are turned on to pull up the coincidence detection signal line MATCH0 of the first channel and the coincidence detection signal line MATCH1 of the second channel to the power supply potential.

The operation of the circuit shown in FIG. 12 is now explained. During the time the test compare enable signal TCMPE is low, the P-channel MOS transistors P21, P23, P24 and P26 are turned on to pre-charge the coincidence detection signal lines MATCH0 and MATCH1 of the first and second channels and the comparison control signal lines COMP0_B and COMP1_B of the first and second channels to the power supply potential (high level). An output of the NAND circuit 312, supplied with the coincidence detection signals MATCH0, MATCH1 of the first and second channels, is in the low level, with the error flag ERR_B being at a high level.

When the test compare enable signal TCMPE is in a high level, the N-channel MOS transistors N25, N31 are turned on, with the comparison control signals COMP0_B and COMP1_B of the first and second channels being at a low level.

If, in any of the comparators (CCMPN) of the first channel, readout data and expectation data from the associated read amplifiers (Ramp) are non-coincident with each other, the coincidence detection signal line MATCH0 and the comparison control signal line COMP0_B become current conductive, and the coincidence detection signal line MATCH0 is discharged, with the potential thereof falling to the ground potential.

When the coincidence detection signal line MATCH0 is at a low level, the output of the NAND circuit 312 goes high, with the error flag ERR_B going low. That is, the 'fail' is output.

If, in any of the comparators (CCMPN), connected to the coincidence detection signal line MATCH1 and the comparison control signal line COMP1_B of the second channel, readout data and expectation data from the associated read amplifiers (Ramp) are non-coincident with each other, the coincidence detection signal line MATCH1 and the comparison control signal line COMP1_B become current conductive, and the coincidence detection signal line MATCH1 is discharged, with the potential thereof falling to the ground potential. When the coincidence detection signal line MATCH1 is at a low level, the output of the NAND circuit 312 goes high, with the error flag ERR_B going low. That is, the 'fail' is output. In this manner, if at least one comparator (CCMPN) of plural comparators (CCMPN) of the first and second channels has detected non-coincidence between the readout data and the expectation data, the error flag ERR_B goes low.

In the present embodiment, the number of the comparators (CCMPN) is optionally set, depending on the scale of the parallel circuit.

Figure 16:
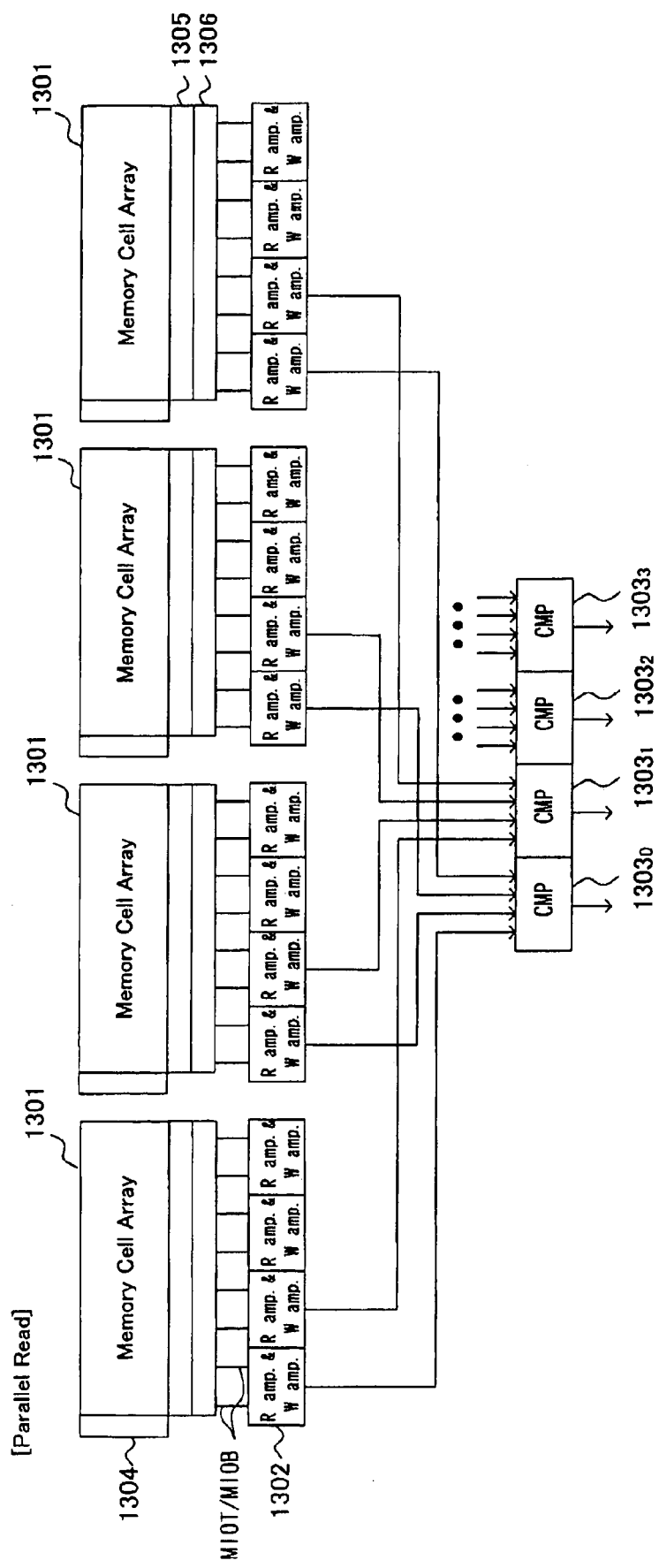
FIG. 16 shows an example of a conventional test circuit for a semiconductor storage device.

An illustrative embodiment of the system structure is now explained. If, in the case of a 128M DRAM configuration, shown in FIG. 11, 32 data terminals (input/output terminals) DQ are provided, and the memory cell array is formed by a 4-bank cell array, 32×4=128 sets of each of the write register, read/write amplifier (Ramp and Wamp) and the comparator (CCMPN) are provided, the size of each memory cell array is 4M, the cell array of each bank is 1M, X (row) of the cell array is 4K, Y (column) is 256. Four pairs of the I/O line pairs MIOT/MIOB are connected per cell array. Hence, one of the 64 bit line pairs and sense amplifiers 101-3 of the cell array, which have been selected by Y-switch (column decoder 101-4), are connected to the IO line pair MIOT/MIOB. In the present embodiment, a parallel test is possible by parallel write from the 128 write amplifiers (Wamp), parallel read and comparison in the 128 read amplifiers (Ramp) and comparators (CCMPN). The test data may be supplied e.g. from the data terminal DQ7 to the 128 write registers 103 in common, as described above. Four of the decision circuits CCMPC may be provided and four error flag signals ERR_B may be output. Alternatively, four error flag signals ERR_B may be supplied to a four-bit coincidence detection circuit (1303 of FIG. 16) for compression to one bit. In such system, the values of the write register 103 may be freely inverted or remain non-inverted by the inversion control signal DIM from an external terminal and output in this inverted or non-inverted state to enable facilitated realization of a test in which the test pattern is changed frequently.

In the above-described embodiment, the present invention is applied to the DDR·SDRAM as a clock synchronization type memory. However, the present invention is not limited to the DDR·SDRAM and may equally be applied to the QDR (Quad data rate) type SDRAM.

Although the present invention has been explained with reference to preferred embodiments thereof, it is to be noted that various modifications or corrections that may occur to those skilled in the art should be comprised within the scope of the invention as defined in the claims.

The meritorious effects of the present invention are summarized as follows. According to the present invention, described above, the write register for normal mode write is used as write register/expectation register for the test mode, so that it is unnecessary to provide a register newly for the test mode, thus suppressing the increase in the circuit scale.

Moreover, according to the present invention, the write register value maybe freely inverted or remain non-inverted by the inversion control signal from the external terminal, and output in the so inverted or non-inverted state, so that marching or a test with frequent data change in the test pattern may readily be realized. According to the present invention, the write data and the expectation data may be changed without changing the test data for a parallel test held by the write register and hence the present invention may be applied with advantage to a parallel test employing a test device such as a tester or a wafer prover.

In addition, according to the present invention, the readout data from the memory cell are compared to the write register value to decide on 'pass' or 'fail', thus improving the testability. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor storage device comprising:
a memory cell array including a plurality of memory cells provided as an array at the intersections of a plurality of word lines and a plurality of bit lines;
a plurality of sense amplifiers connected to said bit lines of said memory cell array;
a column decoder selecting bit lines;
an IO line connected to each of the bit lines selected by said column decoder, each said IO line being a data line exchanging write data and readout data with said memory cell array, two of said IO lines comprising an IO line pair;
a write register connected to each said IO line pair, each write register for storing and holding the write data entered from a data terminal of the semiconductor storage device;
a write amplifier driving and outputting to each said IO line pair based on the write data held by said write register;
a read amplifier connected to each said IO line pair and amplifying readout data from a connected memory cell;
plural comparators and plural inversion control circuits, a different comparator and a different control circuit connected to each read amplifier and connected to each write register, each comparator comparing the readout data amplified by said connected read amplifier and the expectation data applied from said connected write register via the connected inversion control circuit; and
the inversion control circuit supplying non-inverted and inverted values of data stored in said write register, based on an input inversion control signal input to said inversion control circuit; wherein,
an output of each said inversion control circuit is supplied as said expectation data to said connected comparator;
the write data stored in each said write amplifier is written in the memory cell of the selected address during the normal operation and during testing;
data is written in the memory cells during testing through each said write register, each connected inversion control circuit and each connected said write amplifier; and wherein
the readout data read out from said memory cell and amplified by said read amplifier and expectation data output from said inversion control circuit supplied with data held by said write register are supplied to said comparator comparing the readout data and the expectation data.

2. The semiconductor storage device as defined in claim 1 further comprising a selector supplied with data entered from a data terminal and with test data supplied from a preset data terminal, during testing;
said selector outputting the test data during testing to said write register.

3. The semiconductor storage device as defined in claim 1, wherein, each said connected write register and comparator forms one set of a plurality of sets of said write register and said comparator, in association with one pair of the IO lines, and
in a parallel test in which data from said plural write registers are written in parallel in said memory cell array, the value of said inversion control signal entered to said control circuit associated with said write register is changed, without re-writing the data held by said plural write registers to provide for a variable pattern of application of said parallel test and a variable expectation pattern.

4. The semiconductor storage device as defined in claim 1 wherein the semiconductor storage device is of a clock synchronization pattern and includes
a circuit expanding data, serially entered at a data input terminal at a rate of two data per one clock cycle, into two phases, for expansion to parallel data, expanding four serial data per two clock cycles into four parallel data; and wherein
the four parallel data are held by associated four write registers; and wherein
said data are written in parallel in the memory cells for said one data input terminal via four write amplifiers from four write registers associated with said one data input terminal.

5. The semiconductor storage device as defined in claim 1 wherein the plural comparators provided for said plural read amplifiers are connected common to a common signal line indicating the results of comparison, and wherein, if at least one of said plural comparators detects noncoincidence of said readout data and the expectation data, a 'fail' information is output to said common signal line.

6. The semiconductor storage device as defined in claim 5 further comprising
a decision circuit outputting the results of 'pass'/ 'fail' decision of the totality of the plural comparators, based on the value of said common signal line connected to said plural comparators in common.

7. The semiconductor storage device as defined in claim 5 wherein
said common signal line is composed of a first signal line for transmitting a coincidence detection signal and a second signal line for transmitting a comparison control signal;

before the start of the comparison operation in said comparator, said first signal line and the second signal line are set to a first value in advance;

for the comparison operation, said second signal line is set to a second value;

a plurality of said comparators are connected in parallel across said first and second signal lines;

said comparator performing control so that, when said readout data coincides with said expectation value, said first signal line and the second signal line maintain said first and second values, respectively; and wherein when said readout data is not coincident with said expectation data, the current is caused to flow through said first signal line and the second signal line to provide for the same current value.

8. The semiconductor storage device as defined in claim 7 wherein said comparator includes first and second switching devices, connected in series across said first and second signal lines, said first and second switching devices each having a control terminal supplied with said readout data and a complementary signal of said expectation data so as to be controlled on or off, and third and fourth switching devices, connected in series across said first and second signal lines, said third and fourth switching devices each having a control terminal supplied with a complementary signal of said readout data and said expectation data so as to be controlled on or off;

said first to fourth switch devices being formed by path transistors of the same conductivity type.

9. The semiconductor storage device as defined in claim 7 further comprising a decision circuit connected to said first signal line and the second signal line, connected to said plural comparators in common, said decision circuit outputting the results of 'pass'/'fail' decision of said plural comparators in their entirety; said decision circuit including a circuit setting said first signal line and the second signal line to said first value to one of the power supply potential and the ground potential;

a circuit setting said second signal line to said second value, to the other of said power supply potential and the ground potential, when the value of a compare enable signal controlling the comparison operation indicates the comparison; and a circuit generating and outputting an error flag from the value of said first signal line.

* * * * *